(12) United States Patent
Bui et al.

(10) Patent No.: US 9,035,412 B2
(45) Date of Patent: May 19, 2015

(54) THIN ACTIVE LAYER FISHBONE PHOTODIODE WITH A SHALLOW N+ LAYER AND METHOD OF MANUFACTURING THE SAME

(71) Applicant: OSI Optoelectronics, Inc., Hawthorne, CA (US)

(72) Inventors: Peter Steven Bui, Cerritos, CA (US); Narayan Dass Taneja, Long Beach, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 0 days.

(21) Appl. No.: 14/280,808

(22) Filed: May 19, 2014

(65) Prior Publication Data
US 2015/0014804 A1    Jan. 15, 2015

Related U.S. Application Data

(63) Continuation of application No. 12/559,498, filed on Sep. 15, 2009, now Pat. No. 8,766,392, which is a continuation-in-part of application No. 11/744,908, filed on May 7, 2007, now Pat. No. 8,164,151.

(Continued)

(51) Int. Cl.
*H01L 31/102* (2006.01)
*H01L 27/146* (2006.01)

(52) U.S. Cl.
CPC ...... *H01L 27/14643* (2013.01); *H01L 27/1462* (2013.01)

(58) Field of Classification Search
USPC .......................... 257/290–292, 414, 431–496,
257/E21.008–E21.021, E21.364; 438/171, 438/190, 210, 238–253, 329, 379, 387, 444, 438/901
See application file for complete search history.

(56) References Cited

U.S. PATENT DOCUMENTS

| 3,041,226 A | 6/1962 | Pennington |
| 3,713,921 A | 1/1973 | Fleischer |
| 3,765,969 A | 10/1973 | Kragness |
| 3,801,390 A | 4/1974 | Lepselter |
| 3,808,068 A | 4/1974 | Johnson |

(Continued)

FOREIGN PATENT DOCUMENTS

| EP | 0347157 A2 | 12/1989 |
| EP | 0436282 A2 | 7/1991 |

(Continued)

OTHER PUBLICATIONS

Fukano et al., 'High-Responsivity and Low-Operation-Voltage Edge-Illuminated Refracting-Facet Photodiodes with Large Alignment Tolerance for Single-Mode Fiber', Journal of Lightwave Technology, vol. 16, No. 5, May 1997.

(Continued)

*Primary Examiner* — David Vu
*Assistant Examiner* — Jonathan Han
(74) *Attorney, Agent, or Firm* — Novel IP

(57) ABSTRACT

The present invention is directed toward a detector structure, detector arrays, and a method of detecting incident radiation. The present invention comprises a photodiode array and method of manufacturing a photodiode array that provides for reduced radiation damage susceptibility, decreased affects of crosstalk, reduced dark current (current leakage) and increased flexibility in application.

11 Claims, 22 Drawing Sheets

Related U.S. Application Data

(60) Provisional application No. 61/159,732, filed on Mar. 12, 2009, provisional application No. 61/099,768, filed on Sep. 24, 2008, provisional application No. 61/096,877, filed on Sep. 15, 2008.

(56) References Cited

U.S. PATENT DOCUMENTS

| | | | |
|---|---|---|---|
| 3,887,936 A * | 6/1975 | Shannon et al. ................ 257/80 |
| 3,895,976 A | 7/1975 | Dumas | |
| 3,982,269 A | 9/1976 | Torreno | |
| 4,079,405 A | 3/1978 | Ohuchi | |
| 4,190,467 A | 2/1980 | Lien | |
| 4,200,472 A | 4/1980 | Chappell | |
| 4,210,923 A | 7/1980 | North | |
| 4,219,368 A | 8/1980 | David | |
| 4,238,760 A | 12/1980 | Carr | |
| 4,290,844 A | 9/1981 | Rotolante | |
| 4,329,702 A | 5/1982 | Wallace | |
| 4,616,247 A | 10/1986 | Chang | |
| 4,857,980 A | 8/1989 | Hoeberechts | |
| 4,874,939 A | 10/1989 | Nishimoto | |
| 4,887,140 A | 12/1989 | Wang | |
| 4,904,608 A | 2/1990 | Gentner | |
| 4,904,861 A | 2/1990 | Epstein | |
| 4,998,013 A | 3/1991 | Epstein | |
| 5,040,039 A | 8/1991 | Hattori | |
| 5,049,962 A | 9/1991 | Huang | |
| 5,053,318 A | 10/1991 | Gulla | |
| 5,144,379 A | 9/1992 | Eshita | |
| 5,214,276 A | 5/1993 | Himoto | |
| 5,237,197 A | 8/1993 | Snoeys | |
| 5,252,142 A | 10/1993 | Matsuyama | |
| 5,252,851 A | 10/1993 | Mita | |
| 5,254,480 A | 10/1993 | Tran | |
| 5,276,955 A | 1/1994 | Noddin | |
| 5,315,148 A | 5/1994 | Fujimura | |
| 5,408,122 A | 4/1995 | Reele | |
| 5,414,295 A | 5/1995 | LeRoux | |
| 5,418,396 A | 5/1995 | Mita | |
| 5,430,321 A | 7/1995 | Effelsberg | |
| 5,446,308 A | 8/1995 | Piccone | |
| 5,446,751 A | 8/1995 | Wake | |
| 5,457,322 A | 10/1995 | Kitaguchi | |
| 5,501,990 A | 3/1996 | Holm | |
| 5,517,052 A | 5/1996 | Ishaque | |
| 5,543,736 A | 8/1996 | Gardner | |
| 5,576,559 A | 11/1996 | Davis | |
| 5,599,389 A | 2/1997 | Iwasaki | |
| 5,608,237 A | 3/1997 | Aizawa | |
| 5,656,508 A | 8/1997 | So | |
| 5,670,383 A | 9/1997 | Piccone | |
| 5,670,817 A | 9/1997 | Robinson | |
| 5,698,454 A | 12/1997 | Zommer | |
| 5,777,352 A | 7/1998 | Reele | |
| 5,818,096 A | 10/1998 | Ishibashi | |
| 5,825,047 A | 10/1998 | Ajisawa | |
| 5,869,834 A | 2/1999 | Wipenmyr | |
| 5,880,482 A | 3/1999 | Adesida | |
| 5,889,313 A | 3/1999 | Parker | |
| 5,914,502 A | 6/1999 | Simmonet | |
| 5,923,720 A | 7/1999 | Barton | |
| 5,928,438 A | 7/1999 | Salami | |
| 6,027,956 A | 2/2000 | Irissou | |
| 6,031,254 A | 2/2000 | Quoirin | |
| 6,075,275 A | 6/2000 | Irissou | |
| 6,121,552 A | 9/2000 | Brosnihan | |
| 6,144,379 A | 11/2000 | Bertram | |
| 6,169,319 B1 | 1/2001 | Malinovich | |
| 6,175,141 B1 | 1/2001 | Hofbauer | |
| 6,204,087 B1 | 3/2001 | Parker | |
| 6,218,684 B1 | 4/2001 | Kuhara | |
| 6,218,704 B1 | 4/2001 | Brown | |
| 6,277,668 B1 | 8/2001 | Goossen | |
| 6,303,967 B1 | 10/2001 | Irissou | |
| 6,326,300 B1 | 12/2001 | Liu | |
| 6,326,649 B1 | 12/2001 | Chang | |
| 6,352,517 B1 | 3/2002 | Flock | |
| 6,392,282 B1 | 5/2002 | Sahara | |
| 6,399,991 B1 | 6/2002 | Ando | |
| 6,426,991 B1 | 7/2002 | Mattson | |
| 6,438,296 B1 | 8/2002 | Kongable | |
| 6,458,619 B1 | 10/2002 | Irissou | |
| 6,483,130 B1 | 11/2002 | Yang | |
| 6,489,635 B1 | 12/2002 | Sugg | |
| 6,504,158 B2 | 1/2003 | Possin | |
| 6,504,178 B2 | 1/2003 | Carlson | |
| 6,507,050 B1 | 1/2003 | Green | |
| 6,510,195 B1 | 1/2003 | Chappo | |
| 6,541,836 B2 | 4/2003 | Iwanczyk | |
| 6,546,171 B2 | 4/2003 | Fukutomi | |
| 6,569,700 B2 | 5/2003 | Yang | |
| 6,593,636 B1 | 7/2003 | Bui | |
| 6,613,974 B2 | 9/2003 | Husher | |
| 6,667,528 B2 | 12/2003 | Cohen | |
| 6,670,258 B2 | 12/2003 | Carlson | |
| 6,677,182 B2 | 1/2004 | Carlson | |
| 6,683,326 B2 | 1/2004 | Iguchi | |
| 6,690,078 B1 | 2/2004 | Irissou | |
| 6,713,768 B2 | 3/2004 | Iwanczyk | |
| 6,734,416 B2 | 5/2004 | Carlson | |
| 6,762,473 B1 | 7/2004 | Goushcha | |
| 6,772,729 B2 | 8/2004 | Brosseau | |
| 6,815,790 B2 | 11/2004 | Bui | |
| 6,826,080 B2 | 11/2004 | Park | |
| 6,853,046 B2 | 2/2005 | Shibayama | |
| 6,914,271 B2 | 7/2005 | Menard | |
| 7,019,338 B1 | 3/2006 | Ballon | |
| 7,038,288 B2 | 5/2006 | Lai | |
| 7,057,254 B2 | 6/2006 | Bui | |
| 7,057,257 B2 | 6/2006 | Tran | |
| 7,112,465 B2 | 9/2006 | Goushcha | |
| 7,138,697 B2 | 11/2006 | Chu | |
| 7,148,464 B2 | 12/2006 | Shibayama | |
| 7,157,785 B2 | 1/2007 | Takei | |
| 7,161,155 B1 | 1/2007 | Deych | |
| 7,198,972 B2 | 4/2007 | Sato | |
| 7,242,009 B1 | 7/2007 | Wilson | |
| 7,242,069 B2 | 7/2007 | Bui | |
| 7,256,386 B2 | 8/2007 | Carlson | |
| 7,256,470 B2 | 8/2007 | Bui | |
| 7,279,731 B1 | 10/2007 | Bui | |
| 7,423,305 B2 | 9/2008 | Shinohara | |
| 7,456,453 B2 | 11/2008 | Inoue | |
| 7,470,966 B2 | 12/2008 | Bui | |
| 7,560,790 B2 | 7/2009 | Shibayama | |
| 7,560,791 B2 | 7/2009 | Wilson | |
| 7,576,369 B2 | 8/2009 | Bui | |
| 7,579,666 B2 | 8/2009 | Bui | |
| 7,622,785 B2 | 11/2009 | Sasagawa | |
| 7,649,236 B2 | 1/2010 | Fujii | |
| 7,655,999 B2 | 2/2010 | Bui | |
| 7,656,001 B2 | 2/2010 | Bui | |
| 7,709,921 B2 | 5/2010 | Bui | |
| 7,728,367 B2 | 6/2010 | Bui | |
| 7,810,740 B2 | 10/2010 | Shibayama | |
| 7,880,258 B2 | 2/2011 | Bui | |
| 7,898,055 B2 | 3/2011 | Bui | |
| 7,948,049 B2 | 5/2011 | Bui | |
| 7,968,964 B2 | 6/2011 | Bui | |
| 8,035,183 B2 | 10/2011 | Bui | |
| 8,049,294 B2 | 11/2011 | Bui | |
| 8,120,023 B2 | 2/2012 | Bui | |
| 8,164,151 B2 | 4/2012 | Bui | |
| 8,278,729 B2 | 10/2012 | Bui | |
| 8,324,670 B2 | 12/2012 | Bui | |
| 8,338,905 B2 | 12/2012 | Bui | |
| 8,399,909 B2 | 3/2013 | Bui | |
| 8,461,541 B2 | 6/2013 | Garcia | |
| 8,476,725 B2 | 7/2013 | Bui | |
| 8,519,503 B2 | 8/2013 | Bui | |
| 2001/0034105 A1 | 10/2001 | Carlson | |
| 2002/0020893 A1 | 2/2002 | Lhorte | |
| 2002/0056845 A1 | 5/2002 | Iguchi | |

(56) References Cited

U.S. PATENT DOCUMENTS

| | | |
|---|---|---|
| 2002/0148967 A1 | 10/2002 | Iwanczyk |
| 2003/0116187 A1 | 6/2003 | Husher |
| 2004/0104351 A1 | 6/2004 | Shibayama |
| 2004/0113185 A1 | 6/2004 | Shibayama |
| 2004/0129991 A1 | 7/2004 | Lai |
| 2004/0135170 A1 | 7/2004 | Menard |
| 2004/0206886 A1 | 10/2004 | Carlson |
| 2004/0222358 A1* | 11/2004 | Bui et al. .................... 250/214.1 |
| 2004/0222482 A1* | 11/2004 | Bui et al. ....................... 257/461 |
| 2004/0241897 A1 | 12/2004 | Rhee |
| 2004/0262652 A1 | 12/2004 | Goushcha |
| 2005/0082640 A1 | 4/2005 | Takei |
| 2005/0184354 A1 | 8/2005 | Chu |
| 2005/0186754 A1 | 8/2005 | Kim |
| 2006/0220078 A1 | 10/2006 | Bui |
| 2006/0255420 A1 | 11/2006 | Bui |
| 2006/0278896 A1 | 12/2006 | Inoue |
| 2006/0278898 A1 | 12/2006 | Shibayama |
| 2007/0090394 A1 | 4/2007 | Bui |
| 2007/0257329 A1 | 11/2007 | Bui |
| 2007/0278534 A1 | 12/2007 | Bui |
| 2007/0296005 A1 | 12/2007 | Bui |
| 2008/0067622 A1 | 3/2008 | Bui |
| 2008/0099871 A1 | 5/2008 | Bui |
| 2008/0128846 A1 | 6/2008 | Bui |
| 2008/0277753 A1 | 11/2008 | Bui |
| 2010/0032710 A1 | 2/2010 | Bui |
| 2010/0065939 A1 | 3/2010 | Bui |
| 2010/0084730 A1 | 4/2010 | Bui |
| 2010/0155874 A1 | 6/2010 | Bui |
| 2010/0213565 A1 | 8/2010 | Bui |
| 2011/0079728 A1 | 4/2011 | Garcia |
| 2011/0175188 A1 | 7/2011 | Bui |
| 2012/0086097 A1 | 4/2012 | Bui |
| 2012/0104532 A1 | 5/2012 | Bui |
| 2014/0093994 A1 | 4/2014 | Bui |

FOREIGN PATENT DOCUMENTS

| | | |
|---|---|---|
| EP | 0723301 B1 | 7/2000 |
| EP | 1069626 A2 | 1/2001 |
| EP | 1205983 A1 | 5/2002 |
| WO | 0052766 A1 | 9/2000 |
| WO | 2010031011 | 3/2010 |

OTHER PUBLICATIONS

Y. Atatsu, Y. Muramoto, K. Kato, M. Ikeda, M. Ueki, A. Kozen, T. Kurosaki, K. Kawano, and J. Yoshida, 'Long-wavelength multimode waveguide photodiodes suitable for hybrid optical module integrated with planar lightwave circuit', Electron. Lett., vol. 31, pp. 2098-2100, 1995.

International Search Report PCT/US2009/056875, Jan. 7, 2010, UDT Sensors, Inc.

* cited by examiner

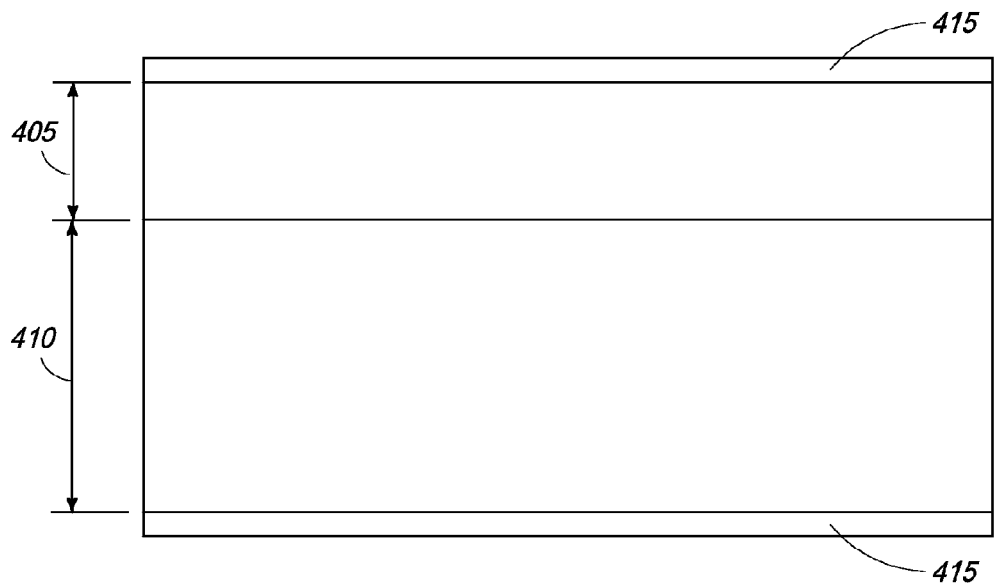
FIG. 4A  *Step 450*
FIG. 4B  *Step 455*

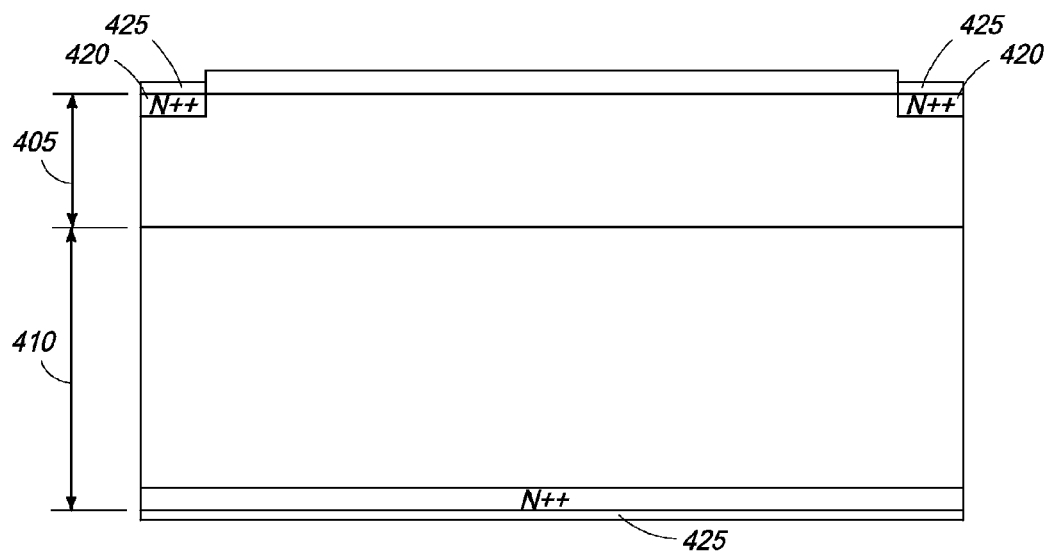
FIG. 4C  Step 460
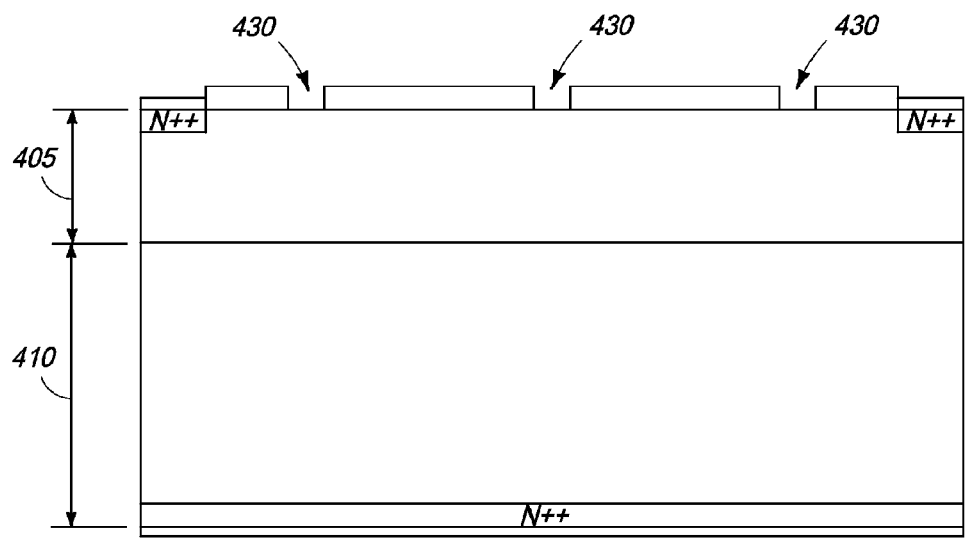
FIG. 4D  Step 465

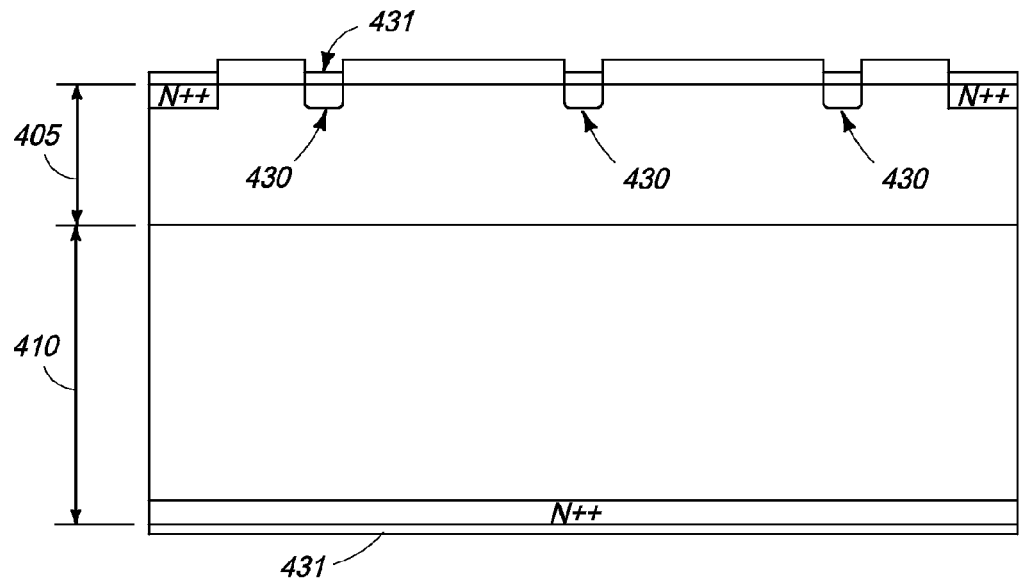
FIG. 4E  Step 470
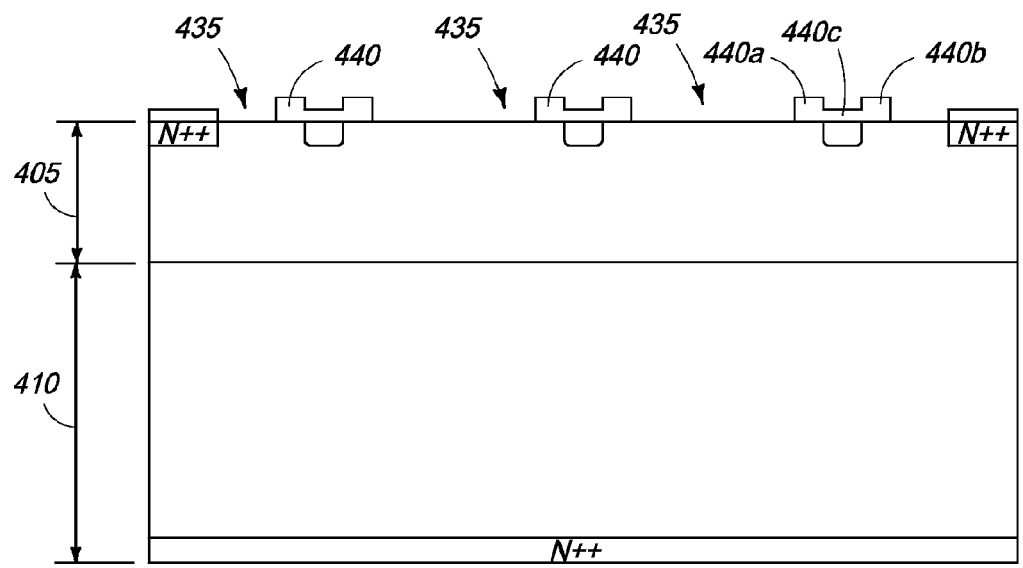
FIG. 4F  Step 475

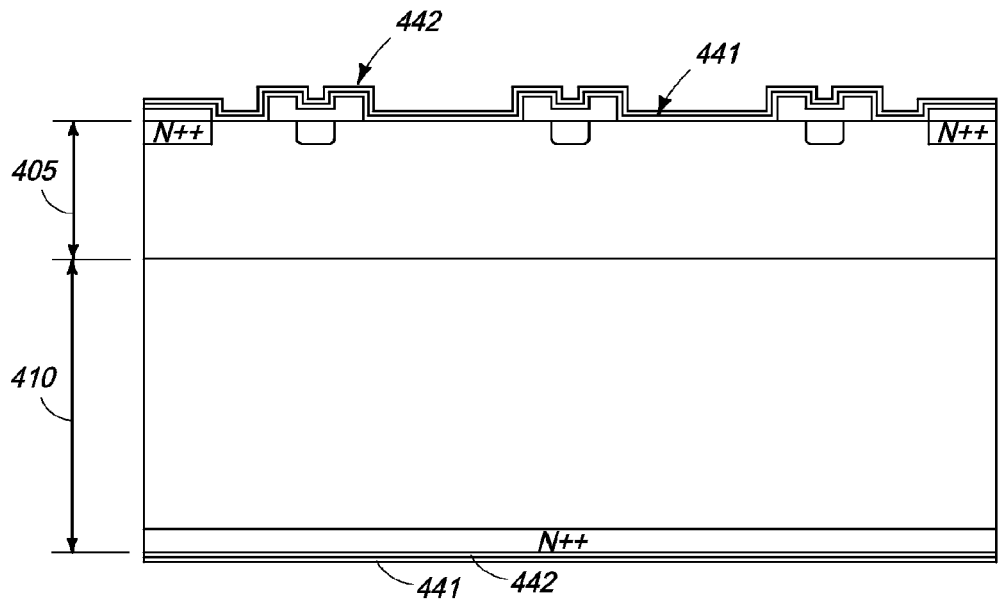
FIG. 4G       Step 480
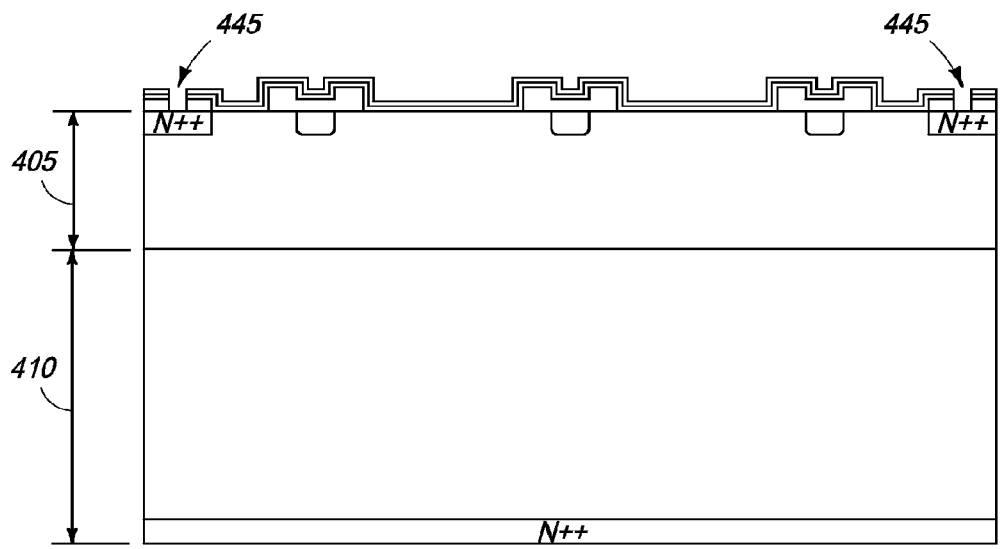
FIG. 4H       Step 485

| ARRAY LAYOUT | DARK CURRENT AT 10mV | CAPACITANCE AT 0V | RESPONSE TIME | RESPONSIVITY AT 540nm |
|---|---|---|---|---|
| 8 BONES | 0.006 nA | 46.1 pF | 60 uS | 0.403 A/W |
| 6 BONES | 0.008 nA | 41.9 pF | 154 uS | 0.391 A/W |
| 5 BONES | 0.020 nA | 37.8 pF | 154 uS | 0.390 A/W |
| 4 BONES | 0.004 nA | 34.8 pF | 179 uS | 0.385 A/W |
| 3 BONES | 0.004 nA | 29.1 pF | 455 uS | 0.352 A/W |

| Bias | Dark Current | Capacitance | Response Time |
|---|---|---|---|
|  | - | oV, 100Hz | 632 nm, flooded |
| V | nA | pF | micro second |
| 0.01 | 0.006 | 46.1 | 60 |
| 1.50 | 0.030 | 33.0 | 72 |
| 3.00 | 0.047 | 29.3 | 64 |

16342Production Device    8 Bones    SN 7

Note: Vr at 1mA Ic 0.64 V

| Bias | Dark Current | Capacitance | Response Time |
|---|---|---|---|
|  | - | oV, 100Hz | 632 nm, flooded |
| V | nA | pF | micro second |
| 0.01 | 0.008 | 41.9 | 154 |
| 1.50 | 0.039 | 30.3 | 124 |
| 3.00 | 0.060 | 27.1 | 131 |

Prototype Device    6 Bones    SN 4

Note: Vr at 1mA Ic 0.63 V

| Bias | Dark Current | Capacitance | Response Time |
|---|---|---|---|
|  | - | oV, 100Hz | 632 nm, flooded |
| V | nA | pF | micro second |
| 0.01 | 0.020 | 37.8 | 154 |
| 1.50 | 0.038 | 27.6 | 147 |
| 3.00 | 0.064 | 24.6 | 140 |

Prototype Device    6 Bones    SN 3

Note: Vr at 1mA Ic 0.63 V

| Bias | Dark Current | Capacitance | Response Time |
|---|---|---|---|
|  | - | oV, 100Hz | 632 nm, flooded |
| V | nA | pF | micro second |
| 0.01 | 0.004 | 34.8 | 179 |
| 1.50 | 0.022 | 26.6 | 164 |
| 3.00 | 0.035 | 23.0 | 186 |

Prototype Device    4 Bones    SN 2

Note: Vr at 1mA Ic 0.63 V

| Bias | Dark Current | Capacitance | Response Time |
|---|---|---|---|
|  | - | oV, 100Hz | 632 nm, flooded |
| V | nA | pF | micro second |
| 0.01 | 0.004 | 29.1 | 455 |
| 1.50 | 0.028 | 21.4 | 384 |
| 3.00 | 0.048 | 19.3 | 400 |

Prototype Device    3 Bones    SN 1

Note: Vr at 1mA Ic 0.63 V

FIG. 8

Step 1055

Step 1060

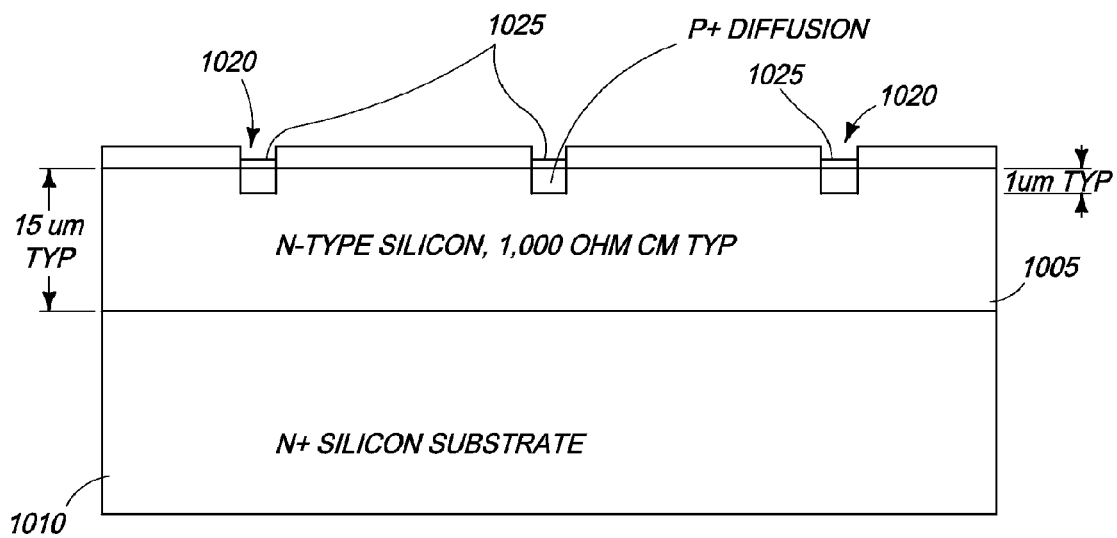
FIG. 10E   Step 1065
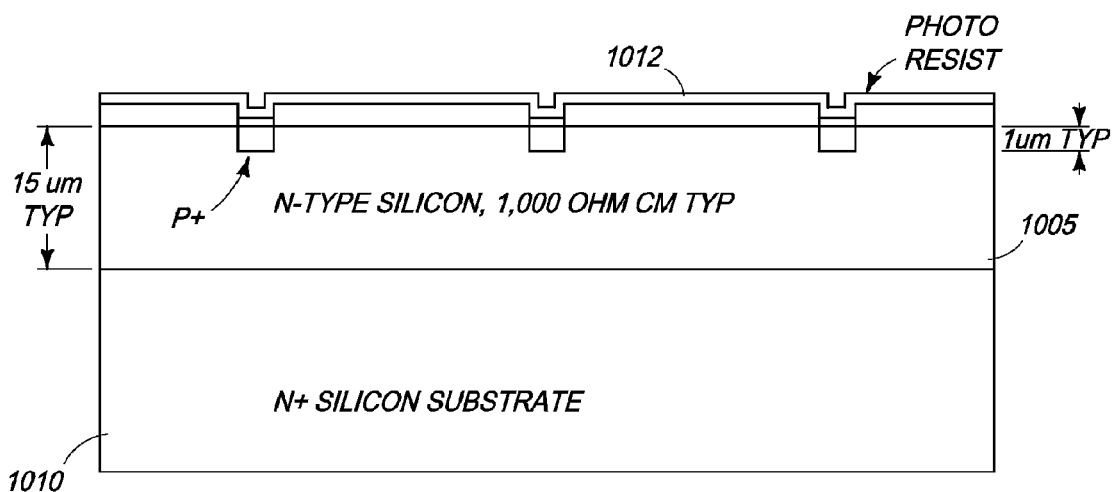
FIG. 10F   Step 1070

Step 1075

Step 1080

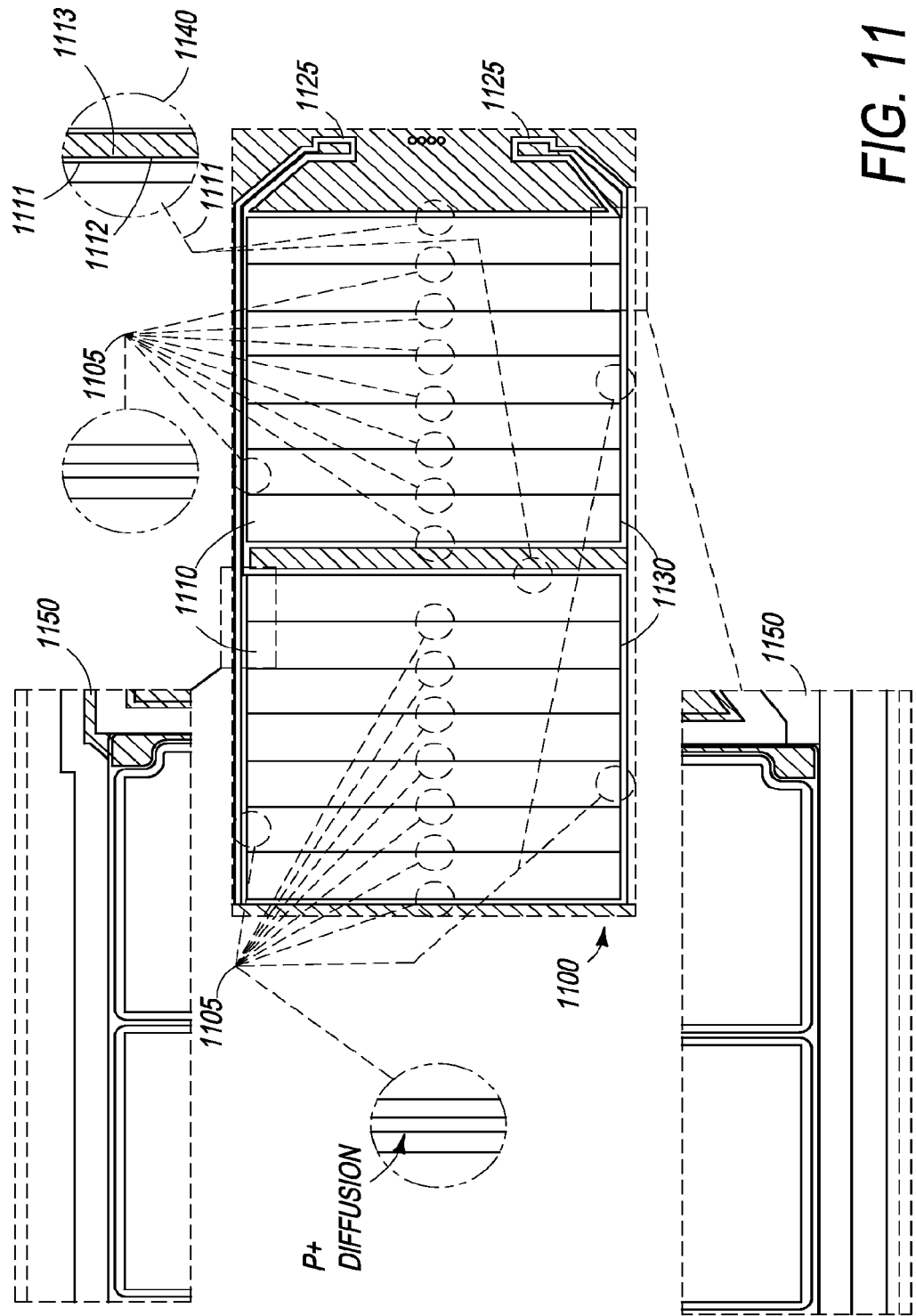

THIN ACTIVE LAYER FISHBONE PHOTODIODE WITH A SHALLOW N+ LAYER AND METHOD OF MANUFACTURING THE SAME

CROSS-REFERENCE

The present invention is a continuation-in-part of U.S. patent application Ser. No. 11/744,908, entitled "Thin Active Layer Fishbone Photodiode and Method of Manufacturing the Same", filed on May 7, 2007. The present invention also relies on each of the following provisional applications for priority: 61/096,877 filed on Sep. 15, 2008, 61/099,768 filed on Sep. 24, 2008, and 61/159,732 filed on Mar. 12, 2009. All of the aforementioned applications are hereby incorporated by reference.

FIELD OF THE INVENTION

The present invention relates to a photodiode array having improved device characteristics. Specifically, the present invention relates to a photodiode device having a fishbone structure that can be fabricated on a thin active layer, such as epi or a thin direct-bonded layer. More specifically, the present invention relates to a photodiode array that has reduced junction capacitance, reduced dark current, and an improved signal-to-noise ratio.

BACKGROUND OF THE INVENTION

Conventional computed tomography (CT) scanners and digital radiography systems use large numbers of X-ray detectors, on the order of several hundred to several thousand, in which each X-ray detector includes a scintillator to convert X-rays into light and a photocell, or photodiode array, to convert light into an electrical signal.

Certain photodiodes have two-electrode radiation-sensitive junctions formed in semiconductor material. Light, which illuminates the junction, creates charge carriers (via mobile or "free" electrons and holes). Doping a semiconductor with a small amount of impurity greatly increases the number of charge carriers within the semiconductor. When a doped semiconductor has excess (majority) holes, it is called p-type and when it contains excess (majority) free electrons, it is known as n-type. The holes in a p-dopes semiconductor are majority carriers while the electrons are minority carriers. In the case of n-type doping, the electrons are the majority carriers and the holes are the minority carriers. The junctions which form where n-type and p-type semiconductors join together are called P-N junctions. At the P-N junction, there forms a region called the depletion zone, which blocks current conduction from the n-type region to the p-type region, but allows current to conduct from the p-type region to the n-type region. The depletion region is void of all majority carriers and is a non-conducting layer. In other words, the recombination of holes and electrons at the P-N junction causes the region to become depleted of mobile charge.

The depletion region forms across the P-N junction when the junction is in thermal equilibrium, i.e. things are in a steady state. Electrons and holes will diffuse into regions with lower concentrations of electrons and holes. N-type semiconductors have an excess of free electrons while P-type semiconductors have an excess of holes. Therefore, when a P-N junction is formed, electrons will diffuse into the P side and holes will diffuse into the N side. When a hole and an electron come into contact, however, they eliminate each other through recombination. This bares the donor atoms adjacent to the depletion region, which are now charged ions. The ions are positive on the N side and negative on the P side, creating an electric field that counteracts the continued diffusion of charge carriers. When the electric field is sufficient to repel incoming holes and electrons, the depletion region reaches its equilibrium width.

Under reverse bias (P negative with respect to N) this potential is increased, further widening the depletion zone. Forward bias (P positive with respect to N) narrows the zone and eventually reduces it to nothing, making the junction conductive and allowing free flow of charge carriers. Thus, it is possible to manipulate the non-conductive layer to allow a flow of electricity in one direction but not the other (opposite) direction. When the P-N junction is forward-biased, electric charge flows freely due to reduced resistance of the P-N junction. When the P-N junction is reverse biased, however, the junction barrier (and therefore resistance) becomes greater and charge flow is minimal.

Essentially active solid-state semiconductor devices, and in particular, silicon photodiodes, are among the most popular photodetectors having a sufficiently high performance over a large wavelength range with ease of use. Silicon photodiodes are sensitive to light in the wide spectral range, extending from deep ultraviolet through visible to near infrared, which is approximately 200 nm to 1100 nm. Silicon photodiodes, by using their ability to detect the presence or absence of minute light intensities, facilitate the extremely precise measurement of these minute light intensities upon appropriate calibration. For example, appropriately calibrated silicon photodiodes detect and measure light intensities varying over a wide range, from very minute light intensities of below $10^{-13}$ watts/$cm^2$ to high intensities above $10^{-3}$ watts/$cm^2$.

Silicon photodiodes can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, security screening and threat detection, thin photochip applications, and a wide range of computing applications.

Typically, photodiode arrays employ a scintillator material for absorbing high energy (ionizing) electromagnetic or charged particle radiation, which, in response, fluoresces photons at a characteristic wavelength. Scintillators are defined by their light output (number of emitted photons per unit absorbed energy) short fluorescence decay times, and optical transparency at wavelengths of their own specific emission energy. The lower the decay time of a scintillator, that is, the shorter the duration of its flashes of fluorescence are, the less so-called "dead time" the detector will have and the more ionizing events per unit of time it will be able to detect. Scintillators are used to detect electromagnetic waves or particles in many security and detection systems, including CT, X-ray, and gamma ray. There, a scintillator converts the energy to light of a wavelength which can be detected by photomultiplier tubes (PMTs) or P-N junction photodiodes.

Photodiodes are typically characterized by certain parameters, such as, among others, electrical characteristics, optical characteristics, current characteristics, voltage characteristics, and noise. Electrical characteristics predominantly comprise shunt resistance, series resistance, junction capacitance, rise or fall time and/or frequency response. Optical characteristics comprise responsivity, quantum efficiency, non-uniformity, and/or non-linearity. Photodiode noise may comprise, among others, thermal noise, quantum, photon or shot noise, and/or flicker noise.

In an effort to increase the signal to noise ratio and enhance the contrast of the signal, it is desirable to increase the light-induced current of photodiodes. Thus, photodiode sensitivity is enhanced while the overall quality of the photodiode is improved. Photodiode sensitivity is crucial in low-level light applications and is typically quantified by a parameter referred to as noise equivalent power (NEP), which is defined as the optical power that produces a signal-to-noise ratio of one at the detector output. NEP is usually specified at a given wavelength over a frequency bandwidth.

Photodiodes absorb photons or charged particles, facilitating detection of incident light or optical power and generating current proportional to the incident light, thus converting the incident light to electrical power. Light-induced current of the photodiode corresponds to the signal while "dark" or "leakage" current represents noise. "Dark" current is that current that is not induced by light, or that is present in the absence of light. Photodiodes process signals by using the magnitude of the signal-to-noise ratio.

Leakage current is a major source of signal offset and noise in current photodiode array applications. Leakage current flows through the photodiode when it is in a "dark" state, or in the absence of light at a given reverse bias voltage applied across the junction. Leakage current is specified at a particular value of reverse applied voltage. Leakage current is temperature dependent; thus, an increase in temperature and reverse bias results in an increase in leakage or dark current. A general rule is that the dark current will approximately double for every 10° C. increase in ambient temperature. It should be noted, however, that specific diode types can vary considerably from this relationship. For example, it is possible that leakage or dark current will approximately double for every 6° C. increase in temperature.

Various approaches have been used in the prior art to reduce, eliminate or control leakage current. For example, U.S. Pat. No. 4,904,861, assigned to Agilent Technologies, Inc., discloses "[an] optical encoder comprising: a plurality of active photodiodes in an array on a semiconductor chip; a code member having alternating areas for alternately illuminating and not illuminating the active photodiodes in response to movement of the code member; means connected to the active photodiodes for measuring current from the active photodiodes; and sufficient inactive photodiode area on the semiconductor chip at each end of the array of active photodiodes to make the leakage current to each end active photodiode of the array substantially equal to the leakage current to an active photodiode remote from an end of the array". Similarly, U.S. Pat. No. 4,998,013, also assigned to Agilent Technologies, Inc. discloses "means for shielding a photodiode from leakage current comprising: at least one active photodiode on a semiconductor chip; means for measuring current from the active photodiode; a shielding area having a photodiode junction substantially surrounding the active photodiode; and means for biasing the shielding area photodiode junction with either zero bias or reverse bias."

U.S. Pat. No. 6,670,258, assigned to Digirad Corporation, discloses "[a] method of fabricating a low-leakage current photodiode array comprising: defining frontside structures for a photodiode on a front side of a substrate; forming a heavily-doped gettering layer on a back surface of the substrate; carrying out a gettering process on the substrate to transport undesired components from the substrate to said gettering layer, and to form another layer in addition to said gettering layer, which is a heavily-doped, conductive, crystalline layer within the substrate; after said gettering process, removing the entire gettering layer; and after said removing, thinning the heavily-doped, conductive, crystalline layer within the substrate to create a native optically transparent, conductive bias electrode layer". Similarly, U.S. Pat. No. 6,734,416, also assigned to Digirad Corporation, discloses "[a] low-leakage current photodiode array comprising: a substrate having a front side and a back side; a plurality of gate regions formed near the front side of the substrate; a backside layer formed within the substrate, near the back side of the substrate, the backside layer having a thickness of approximately 0.25 to 1.0 micrometers and having a sheet resistivity of approximately 50 to 1000 Ohm per square."

U.S. Pat. No. 6,569,700, assigned to United Microelectronics Corporation in Taiwan, discloses "[a] method of reducing leakage current of a photodiode on a semiconductor wafer, the surface of the semiconductor wafer comprising a p-type substrate, a photosensing area for forming a photosensor of the photodiode, and a shallow trench positioned in the substrate surrounding the photosensing area, the method comprising: forming a doped polysilicon layer containing p-type dopants in the shallow trench; using a thermal process to cause the p-type dopants in the doped polysilicon layer to diffuse into portions of the p-type substrate that surround a bottom of the shallow trench and walls of the shallow trench; removing the doped polysilicon layer; filling an insulator into the shallow trench to form a shallow trench isolation (STI) structure; performing a first ion implantation process to form a first n-type doped region in the photosensing area; and performing a second ion implantation process to form a second n-type doped region in the photosensing area."

Also, U.S. Pat. No. 6,504,158, assigned to General Electric Company, discloses "a method of reducing leakage current in an imaging apparatus, including: providing a substrate with at least one radiation-sensitive imaging region therein; forming a guard region in the substrate at or immediately adjacent a cut edge of the substrate to reduce leakage current reaching the at least one radiation-sensitive imaging region from the cut edge when the imaging apparatus is in use; and electrically reverse biasing the at least one radiation-sensitive imaging region and the guard region relative to the substrate."

In certain applications, it is desirable to produce optical detectors having small lateral dimensions and spaced closely together. For example in certain medical applications, it is desirable to increase the optical resolution of a detector array in order to permit for improved image scans, such as computed tomography (CT) scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated.

Thus, an additional disadvantage with conventional photodiode arrays is the amount and extent of crosstalk that occurs between adjacent detector structures, primarily as a result of minority carrier leakage current between diodes. The problem of crosstalk between diodes becomes even more acute as the size of the detector arrays, the size of individual detectors, the spatial resolution, and spacing of the diodes is reduced.

Various approaches have been used to minimize such crosstalk including, but not limited to, providing inactive photodiodes to balance the leakage current, as described in U.S. Pat. Nos. 4,904,861 and 4,998,013 to Epstein et al., the utilization of suction diodes for the removal of the slow diffusion currents to reduce the settling time of detectors to acceptable levels, as described in U.S. Pat. No. 5,408,122, and providing a gradient in doping density in the epitaxial layer, as described in U.S. Pat. No. 5,430,321 to Effelsberg.

In addition to leakage current and effects of crosstalk, noise is often a limiting factor for the performance of any device or system. In almost every area of measurement, the limit to the detectability of signals is set by noise, or unwanted signals that obscure the desired signal. As described above, the NEP is used to quantify detector noise. Noise issues generally have an important effect on device or system cost. Conventional photodiodes are particularly sensitive to noise issues. Like other types of light sensors, the lower limits of light detection for photodiodes are determined by the noise characteristics of the device.

As described above, the typical noise components in photodiodes include thermal noise; quantum or shot noise; and flicker noise. These noise components collectively contribute to the total noise in the photodiode. Thermal noise, or Johnson noise, is inversely related to the value of the shunt resistance of photodiode and tends to be the dominant noise component when the diode is operated under zero applied reverse bias conditions. Shot noise is dependent upon the leakage or dark current of photodiode and is generated by random fluctuations of current flowing through the device, which may be either dark current or photocurrent. Shot noise tends to dominate when the photodiode is used in photoconductive mode where an external reverse bias is applied across the device. As an example, detector noise generated by a planar diffused photodiode operating in the reverse bias mode is a combination of both shot noise and thermal noise. Flicker noise, unlike thermal or shot noise, bears an inverse relationship to spectral density. Flicker noise may dominate when the bandwidth of interest contains frequencies less than 1 kHz.

Secondary issues also contribute to dark noise and other noise sources that impact photodiode sensitivity. These include primarily determination and/or selection of apt active area specifications (geometry and dimensions), response speed, quantum efficiency at the wavelength of interest, response linearity, and spatial uniformity of response, among others.

In CT applications, such as those employed for baggage screening, it is desirable to have high density photodiode arrays with low dark current, low capacitance, high signal-to-noise ratio, high speed and low crosstalk.

As mentioned above, however, there are numerous problems with conventional photodiodes that attempt to achieve these competing and often conflicting characteristics. For example, in order to achieve low capacitance the photodiode can be fabricated on a high resistivity (on the order of 4000-6000 Ωcm) silicon material. Using a high resistivity material, however, causes the device to have high dark current.

FIG. 1 is a cross-sectional view of a conventional, prior art fishbone photodiode device 100. The photodiode array 100 comprises substrate wafer 105, which is a thick bulk wafer having an active area thickness on the order of 275-400 μm. As shown in FIG. 1 on the conventional fishbone photodiode device some photogenerated holes 110 move randomly in various directions, such as paths 115, in the thick active volume 106 of the bulk starting material wafer. Since minority carrier lifetime is limited, many of these photogenerated holes are lost due to recombination of holes and electrons in the bulk material, which causes a reduction in charge collection efficiency or responsivity of the photodiode.

In order to improve charge collection efficiency in this prior art fishbone photodiode device, the p+ diffused bones need to be placed relatively close to each other. This is disadvantageous, however, because a relatively large number of p+ fishbones is needed when placing the p+ diffused bones closer together, resulting in high junction capacitance. Typically, charge carriers that are photo-generated further from the P-N junction can diffuse toward the p+ diffused "bones" and be collected by the depletion region.

In addition, the fishbone photodiode device in the prior art as shown in FIG. 1 is disadvantageous because the high volume, thick active layer 105 that is used to fabricate the photodiode results in high dark current, since dark current is proportional to the overall volume of the active layer of the device.

In addition, the conventional photodiode array described above with respect to FIG. 1 is disadvantageous in that the photodiode tends to degrade in shunt resistance since the P-N junction is passivated by relatively thin antireflective layers, such as silicon oxide on the order of 150 Å and silicon nitride on the order of 425 Å.

The result is a fishbone photodiode having high noise characteristics, and thus, a poor signal to noise ratio.

What is needed is a photodiode array that can be fabricated on a thin active layer. In particular, what is needed is a photodiode array that can be fabricated on a thin active layer such as thin epi or thin direct-bonded layer, for fast rise time and better charge collection efficiency.

What is also needed is a photodiode array having reduced junction capacitance and reduced dark current, thus improving the signal to noise ratio of the photodiode array.

What is also needed is a photodiode array having reduced junction capacitance and reduced dark current, thus improving the signal to noise ratio of the photodiode array without sacrificing performance characteristics, such as quantum efficiency.

In addition, what is needed is economically, technically, and operationally feasible methods, apparatuses, and systems for manufacturing photodiode arrays on a thin active layer with reduced junction capacitance and reduced dark current effects.

In addition, what is needed is economically, technically, and operationally feasible methods, apparatuses, and systems for manufacturing photodiode arrays that can be used in computed tomography (CT) scanner applications that improve upon overall performance characteristics of the photodiode array and individual diode elements.

SUMMARY OF THE INVENTION

In one embodiment, the present invention is a photodiode device having a fishbone structure that can be fabricated on a thin active layer, such as epi or a thin direct-bonded layer and having improved device characteristics, including reduced junction capacitance, reduced dark current, and an improved signal-to-noise ratio.

In one embodiment, the present invention is a photodiode array comprising: a thin active layer substrate having at least a front side and a back side; a plurality of photodiodes integrally formed in the thin active layer substrate forming said array; a plurality of metal contacts provided on said front side and said back side, wherein the fabrication of said array comprises: coating said front side of said substrate with oxide via mask oxidation; masking said front side of said substrate with an n+ lithography mask; selectively etching the oxide coating on said front side of said thin active layer substrate using the n+ lithography mask and completely etching the oxide coating on the back side of the substrate; diffusing a n+ layer on said front side and said back side of said substrate forming a n+ region; performing a drive-in oxidation on said front side and said back side of said substrate; masking said front side of said substrate with a p+ lithography mask; selectively etching the oxide coating on said front side of said substrate wafer using the p+ lithography mask; diffusing a p+ layer on said front side of said substrate; applying a drive-in oxidation layer on said front side and said back side of said substrate; masking said front side of said substrate to form at least one active area etch pattern; selectively etching the oxide coating on said front side of said substrate using said active area etch pattern and etching the oxide coating on said back side of said substrate completely; applying at least one antireflective layer on said front side and said back side of said substrate; masking said front side of said substrate wafer using a contact window mask; selectively etching the front side of the substrate using said contact window mask to form at least one contact window and completely etching the at least one antireflective layer from the back side of the substrate; metallizing said front side and said back side of said substrate; and masking and selectively etching said front side of said substrate to form metal contacts.

In one embodiment, the thin active layer has a thickness of 15 µm. In one embodiment, an oxide layer is retained on at least a portion of the front side of the thin active layer to increase the structural rigidity of the device. Optionally, the photodiode of the present invention further comprises a mechanical support bonded to said back side of said thin active area layer substrate. In one embodiment, the mechanical support comprises n+ silicon substrate.

In one embodiment, the p+ mask pattern is a fishbone pattern. In one embodiment, the fishbone pattern p+ mask comprises a plurality of p+ bones further defined by a p+ periphery frame bone. In one embodiment, the distance between adjacent p+ bones in said fishbone pattern is 700 µm.

In one embodiment, the antireflective coating layer is a thin film material, wherein the thin film material is one of an oxide, a sulfide, a fluoride, a nitride, a selenide, or a metal. In one embodiment, the antireflective coating is a silicon dioxide antireflective having a thickness of 150 Å. In another embodiment, the antireflective coating is a silicon nitride antireflective having a thickness of 425 Å.

In another embodiment, the present invention is a photodiode array comprising: a thin active layer substrate having at least a front side and a back side; a mechanical support bonded to said back side of said thin active area substrate; a plurality of photodiodes integrally formed in the thin active layer substrate forming said array; a plurality of metal contacts provided on said front side and said back side, wherein the fabrication of said array comprises: coating said front side of said substrate with oxide via mask oxidation; masking said front side of said substrate with an n+ lithography mask; selectively etching the oxide coating on said front side of said thin active layer substrate using the n+ lithography mask and completely etching the oxide coating on the back side of the substrate; diffusing a n+ layer on said front side and said back side of said substrate forming a n+ region; performing a drive-in oxidation on said front side and said back side of said substrate; masking said front side of said substrate with a p+ lithography mask; selectively etching the oxide coating on said front side of said substrate wafer using the p+ lithography mask; diffusing a p+ layer on said front side of said substrate; applying a drive-in oxidation layer on said front side and said back side of said substrate; masking said front side of said substrate to form at least one active area etch pattern; selectively etching the oxide coating on said front side of said substrate using said active area etch pattern and etching the oxide coating on said back side of said substrate completely; applying at least one antireflective layer on said front side and said back side of said substrate; masking said front side of said substrate wafer using a contact window mask; selectively etching the front side of the substrate using said contact window mask to form at least one contact window and completely etching the at least one antireflective layer from the back side of the substrate; metallizing said front side and said back side of said substrate; and masking and selectively etching said front side of said substrate to form metal contacts.

In yet another embodiment, the present invention is a photodiode array comprising: a thin active area substrate having at least a front side and a back side; a plurality of diode elements integrally formed in the substrate forming said array, wherein each diode element has a p+ fishbone pattern on said front side, further comprising at least one p+ bone and a p+ bone frame periphery, and wherein each p+ bone is protected by a thick oxide layer, and a plurality of front surface cathode and anode contacts, wherein said protected p+ fishbone pattern substantially increases the structural integrity and reduces junction and leakage current between adjacent photodiodes.

In yet another embodiment, the present invention is a photodiode array comprising: a thin active area substrate having at least a front side and a back side; a mechanical support bonded to said back side of said thin active area substrate; a plurality of diode elements integrally formed in the substrate forming said array, wherein each diode element has a p+ fishbone pattern on said front side, further comprising at least one p+ bone and a p+ bone frame periphery, and wherein each p+ bone is protected by a thick oxide layer, and a plurality of front surface cathode and anode contacts, wherein said protected p+ fishbone pattern substantially increases the structural integrity and reduces junction and leakage current between adjacent photodiodes.

In another embodiment, the present invention is a photodiode element and photodiode array comprising a shallow n+ layer between adjacent p+ bones.

In still another embodiment, the present invention is a photodiode element and photodiode array comprising a three p+ bones layout design for each photodiode element.

In another embodiment, the present invention is a photodiode element and photodiode array comprising a four p+ bones layout design for each photodiode element.

In still another embodiment, the present invention is a photodiode element and photodiode array comprising a five p+ bones layout design for each photodiode element.

In still another embodiment, the present invention is a photodiode element and photodiode array comprising a six p+ bones layout design for each photodiode element.

In still another embodiment, the present invention is a photodiode element and photodiode array comprising a seven p+ bones layout design for each photodiode element.

In still another embodiment, the present invention is a photodiode element and photodiode array comprising an eight p+ bones layout design for each photodiode element.

In another embodiment, the present invention is a photodiode element and photodiode array comprising a plurality of p+ bones wherein only the last vertical fishbone of each photodiode element has metal contact bars and that are connected to wire bonding pads.

In another embodiment, the present invention is a photodiode element and photodiode array comprising a plurality of p+ bones wherein all fishbones of each photodiode element comprise metal contact bars and that are connected to wire bonding pads.

In one embodiment, the present invention is directed toward a photodiode array comprising: a) a thin active layer substrate having at least a front side and a back side; b) a plurality of photodiodes integrally formed in the thin active layer substrate forming said array; c) a plurality of metal contacts provided on said front side, wherein the fabrication of said array comprises: coating said front side and said back side of said substrate with an oxide layer via mask oxidation; coating said front side of said substrate with a photoresist layer; masking said front side of said substrate with a p+ lithography mask; selectively etching the oxide layer on said front side said substrate wafer, wherein the p+ lithography mask is used to reveal p+ diffusion regions on said front side and etching the oxide coating on said back side of said substrate completely; diffusing a p+ layer on said front side of said substrate forming p+ diffusion regions; applying a drive-in oxidation layer on said front side of said substrate; coating said front side of said substrate with a photoresist layer; masking said front side of said substrate with a n+ lithography mask to form at least one active area etch pattern; selectively etching the photoresist layer on said front side of said substrate using said active area etch pattern to reveal n+ diffusion regions on said front side; diffusing a n+ layer on said front side of said substrate forming shallow n+ regions between adjacent p+ regions; performing a drive-in oxidation on said front side of said substrate; coating at least one exposed surface on said front side of said substrate with an oxide layer; coating said front side of said substrate with a silicon nitride layer; coating said front side of said substrate with a photoresist layer; masking said front side of said substrate wafer using a contact window mask; selectively etching the front side of the substrate using said contact window mask to form at least one contact window; metallizing said front side and said back side of said substrate; coating said front side of said substrate with a photoresist layer; and masking and selectively etching said front side of said substrate to form metal contacts.

Optionally, the thin active layer has a thickness of 15 μm. The p+ mask pattern is a fishbone pattern. The fishbone pattern p+ mask comprises a plurality of p+ bones further defined by a p+ periphery frame bone. The distance between adjacent p+ bones in said fishbone pattern is 700 μm. The shallow n+ layer has a depth of 0.3 μm. The antireflective coating layer is a thin film material. The thin film material is one of an oxide, a sulfide, a fluoride, a nitride, a selenide, or a metal. The antireflective coating is a silicon dioxide antireflective having a thickness of 150 Å. The antireflective coating is a silicon nitride antireflective having a thickness of 425 Å. The oxide layer is retained on at least a portion of the front side of the thin active layer to increase the structural rigidity of the device. The array further comprising a mechanical support bonded to said back side of said thin active area layer substrate. The mechanical support comprises n+ silicon substrate.

In another embodiment, the photodiode array comprises a) a thin active area substrate having at least a front side and a back side; b) a plurality of diode elements integrally formed in the substrate forming said array, wherein each diode element has a p+ fishbone pattern on said front side, further comprising at least two p+ bones, a p+ bone frame periphery, and at least one shallow n+ region between adjacent p+ regions and wherein each p+ bone is protected by a thick oxide layer, and c) a plurality of front surface cathode and anode contacts, wherein said at least one shallow n+ region increases the stability of the diode element relative to a diode element without said shallow n+ region.

It should be appreciated that, with respect to the p+ fishbone pattern, in conventional photodiodes a p+ bone is passivated by a relatively thin oxide layer, in the range of about 2700 Å. In the present invention, the p+ bone is passivated by about 1 um thick oxide layer plus a 450 Å thick silicon nitride layer, thereby providing a better passivation of the p+n junction. This results in a device with a low dark current, such as 4 pA to 6 pA @ −10 mV for a 25 mm$^2$ active area and remains more stable than conventional photodiodes after assembly, as noted by the data herein.

Additionally, it should be appreciated that in the surface areas between the two adjacent p+ bones, there is an antireflective layer made of a 300 Å oxide layer plus a 450 Å nitride layer. Positive charges in the oxide layer will increase the minority carrier (holes) recombination velocity at the Si—SiO2 interface, thereby resulting in a reduction in charge collection efficiency. The benefit of having a shallow n+ layer between the two p+ bones is that the high-low N+-N junction will reflect the minority carriers, thereby preventing them from reaching the Si—SiO2 interface. Thus, the charges in the SiO2 have no influence on the photo generated minority carriers, and the presence of the shallow N+ layer will make the device more rugged and stable relative to a device without the shallow n+ layer.

Optionally, the thin active layer has a thickness of 15 μm. The p+ mask pattern is a fishbone pattern. The array further comprises a mechanical support bonded to said back side of said thin active area layer substrate.

In another embodiment, the photodiode array comprises a thin active area substrate having at least a front side and a back side; a mechanical support bonded to said back side of said thin active area substrate; a plurality of diode elements integrally formed in the substrate forming said array, wherein each diode element has a p+ fishbone pattern on said front side, further comprising at least two p+ bones, a p+ bone frame periphery, and at least one shallow n+ region between adjacent p+ regions and wherein each p+ bone is protected by a thick oxide layer, and a plurality of front surface cathode and anode contacts, wherein said at least one shallow n+ region increases the stability of the diode element relative to a diode element without said shallow n+ region. The thin active layer has a thickness of 15 μm. The p+ mask pattern is a fishbone pattern.

BRIEF DESCRIPTION OF THE DRAWINGS

These and other features and advantages of the present invention will be appreciated, as they become better understood by reference to the following detailed description when considered in connection with the accompanying drawings, wherein:

FIG. 4A depicts a cross-sectional, planar view of a manufacturing step for fabricating the fishbone photodiode of the present invention, shown in FIG. 3A;

FIG. 4B depicts a cross-sectional, planar view of a manufacturing step for fabricating the fishbone photodiode of the present invention, shown in FIG. 3A;

FIG. 4C depicts a cross-sectional, planar view of a manufacturing step for fabricating the fishbone photodiode of the present invention, shown in FIG. 3A;

FIG. 4D depicts a cross-sectional, planar view of a manufacturing step for fabricating the fishbone photodiode of the present invention, shown in FIG. 3A;

FIG. 4E depicts a cross-sectional, planar view of a manufacturing step for fabricating the fishbone photodiode of the present invention, shown in FIG. 3A;

FIG. 4F depicts a cross-sectional, planar view of a manufacturing step for fabricating the fishbone photodiode of the present invention, shown in FIG. 3A;

FIG. 4G depicts a cross-sectional, planar view of a manufacturing step for fabricating the fishbone photodiode of the present invention, shown in FIG. 3A;

FIG. 4H depicts a cross-sectional, planar view of a manufacturing step for fabricating the fishbone photodiode of the present invention, shown in FIG. 3A;

FIG. 8 is another table depicting example performance characteristics for each of the three, four, five, six and eight bones layout design arrays of FIGS. 6A through 6E at three different bias voltages;

FIG. 10E is a depiction of FIG. 10D, after a p+ diffusion and drive-in oxidation step, in one embodiment of the manufacture of the fishbone photodiode array of the present invention, where shallow n+ layers are formed between adjacent p+ bones;

FIG. 10F is an illustration of FIG. 10E, after a photoresist layer is applied, in one embodiment of the manufacture of the fishbone photodiode array of the present invention, where shallow n+ layers are formed between adjacent p+ bones;

FIG. 11 represents a front-side view of one embodiment of the fishbone photodiode array of the present invention, wherein metal contact bars are placed only in the last vertical fishbone of each of the photodiode elements.

DETAILED DESCRIPTION OF THE INVENTION

Figure 1:
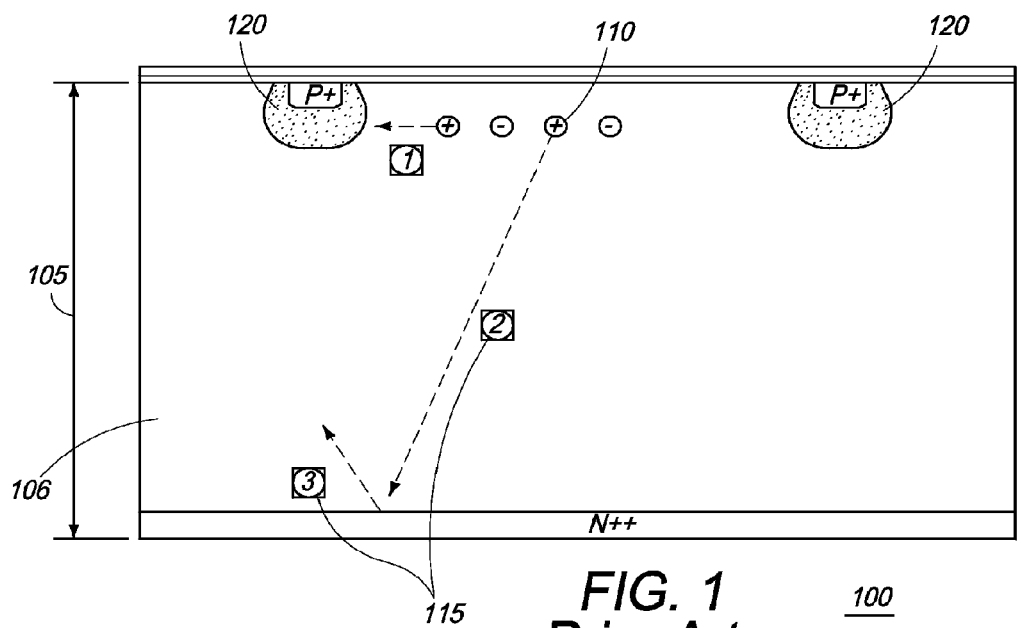
FIG. 1 is a cross-sectional view of a conventional fishbone photodiode device.

The present invention is directed towards a photodiode array having a fishbone design that can be fabricated on a material having intermediate resistivity, such as, but not limited to 1000 Ωcm. Such devices are commonly used in CT and X-ray applications. In particular, the present invention is directed towards a fishbone structure photodiode, comprising p+ diffused areas that are small and narrow, resembling fingers or fishbones. Since the p+ diffused areas are reduced, the capacitance of the resultant photodiode is less than the capacitance of a standard diffused photodiode where the full active area is diffused.

The photodiode array of the present invention thus overcomes the disadvantages of the conventional photodiodes described above by placing the p+ fishbones at a greater distance from each other, thus necessitating the use of fewer p+ fishbones, reducing the overall junction capacitance. In addition, a thin active layer is employed, reducing leakage or "dark" current, since dark current is proportional to the overall volume of the active layer. In addition, the present invention uses a photomask that serves to provide a thick oxide region or layer on top of the P-N junction prior to the growth/deposition of the relatively thin AR layers. Since the junctions are passivated with a thick oxide layer, the device has more structural rigidity and integrity and is less prone to junction degradation. In another embodiment of the present invention, the thin active layer is placed on a mechanical support for added strength and durability.

Thus, the present invention is directed toward a detector structure, detector arrays, and a method of detecting incident radiation. In particular, the present invention is directed toward a fishbone photodiode device that can be fabricated on a thin wafer active area, thus reducing leakage or "dark" current. The present invention is also directed toward a fishbone photodiode device that has reduced junction capacitance owing to the distance between adjacent p+ fishbones, and the relative number of p+ fishbones used to fabricate the device. Because of the reduced dark current and reduced junction capacitance, the overall signal-to-noise ratio of the photodiode array is improved. In addition, the photodiode of the present invention has faster rise times and better charge collection efficiency.

The present invention is also directed towards a photodiode array having reduced junction capacitance and reduced dark current, thus improving the signal to noise ratio of the photodiode array without sacrificing performance characteristics, such as quantum efficiency.

In one embodiment, the present invention is directed toward a fishbone photodiode device that can be fabricated on a thin active layer and that additionally has a thick oxide region on top of the P-N junction prior to the growth/deposition of the relatively thin AR layers, further lending structural integrity to the photodiode device.

The present invention is also directed toward a photodiode array that can be used in computed tomography (CT) scanner applications that improve upon overall performance characteristics of the photodiode array and individual diode elements.

While reference may be made to specific embodiments, such as the use of the photodiode array in CT scanning applications, it should be understood to those of ordinary skill in the art that a photodiode array as described herein may be used in any type of imaging application, including, but not limited to mobile and/or cargo screening systems, people screening systems, and the like.

Reference will now be made to specific embodiments of the present invention. The embodiment described herein is not a general disavowal of any one specific embodiment or used to limit the claims beyond the meaning of the terms used therein. In addition, various modifications to the described embodiment(s) will be readily apparent to those of ordinary skill in the art and the disclosure set forth herein may be applicable to other embodiments and applications without departing from the spirit and scope of the present invention.

Figure 2:
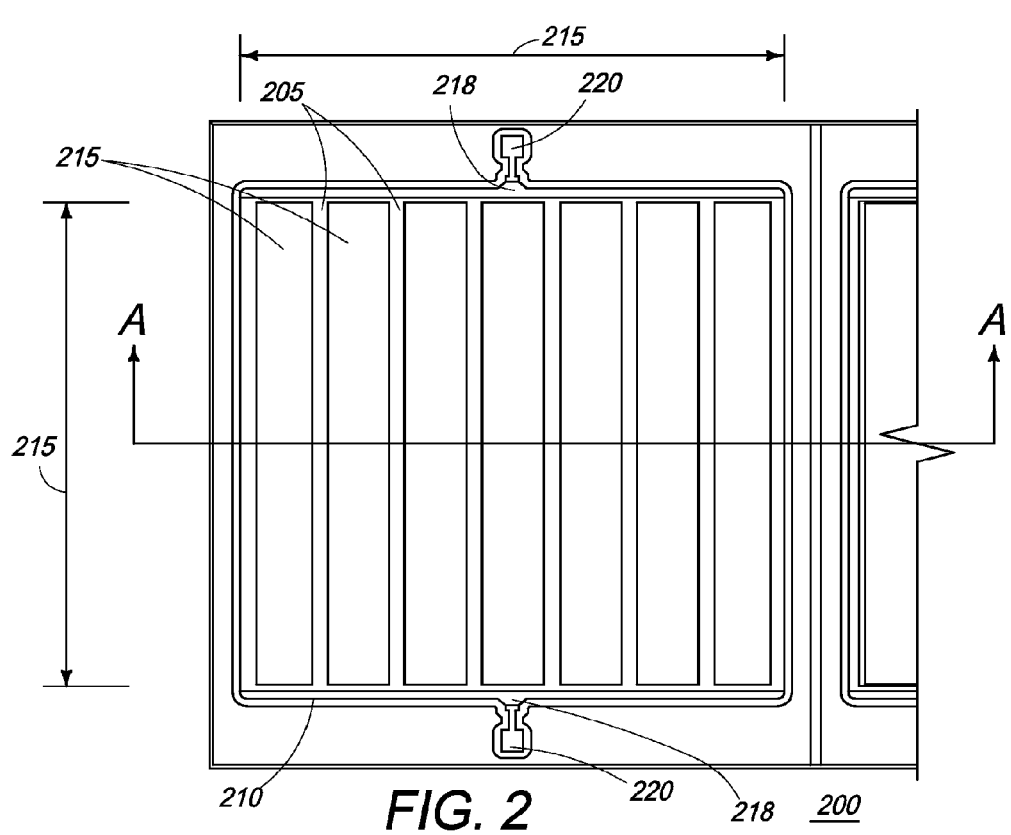
FIG. 2 is a top view of one embodiment of a photodiode fabricated in accordance with the present invention.

FIG. 2 is a top surface view of one embodiment of a photodiode 200 fabricated in accordance with the present invention. As shown in FIG. 2, a p+ mask is employed to create and form a p+ fishbone pattern, comprising p+ bones 205 further defined by a periphery frame bone 210.

Unlike conventional fishbone devices, the present invention employs a wider gap between adjacent p+ diffusion bones. In one embodiment, the gap or distance between adjacent p+ bones 205 is 700 μm. The distance from the center of one p+ diffusion bone to the center of an adjacent p+ diffusion bone is referred to as the "pitch". In one embodiment, the pitch is 714 μm.

Fishbone photodiode 200 further comprises active area 215, contact windows 218, and metallized areas 220, which are described in further detail below with respect to the fabrication steps. In one embodiment, the overall starting material active area 215 is 5 mm×5 mm.

It should be noted herein that typically, the active area in a detector is either of a round or square shape. There is no restriction on the shape of these active areas, however. Many applications may require triangular, radial, or trapezoidal shapes. Conventional photodiodes are manufactured via standard wafer fabrication techniques involving methods of masking and photoetching; thus, it is relatively simple to create a unique geometry. The geometric size and shape of the active area can be held to tolerances of 2 microns. As described herein, the term "region" is used interchangeably with the term "area" and refers to discrete portions within the photodiode chip.

The fabrication of the photodiode described with respect to FIG. 2 will be described in greater detail with respect to the manufacturing steps shown FIGS. 4A-4I and the individual mask elements, as shown in FIGS. 5A-5E.

Figure 3A:
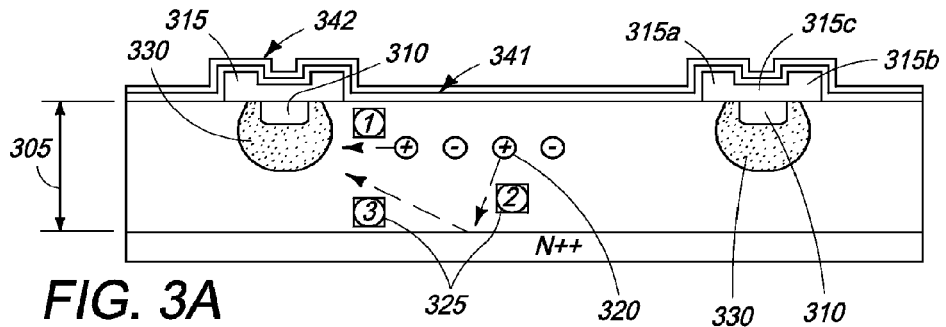
FIG. 3A represents a cross-sectional view of an embodiment of the fishbone photodiode fabricated in accordance with the present invention.
Figure 3B:
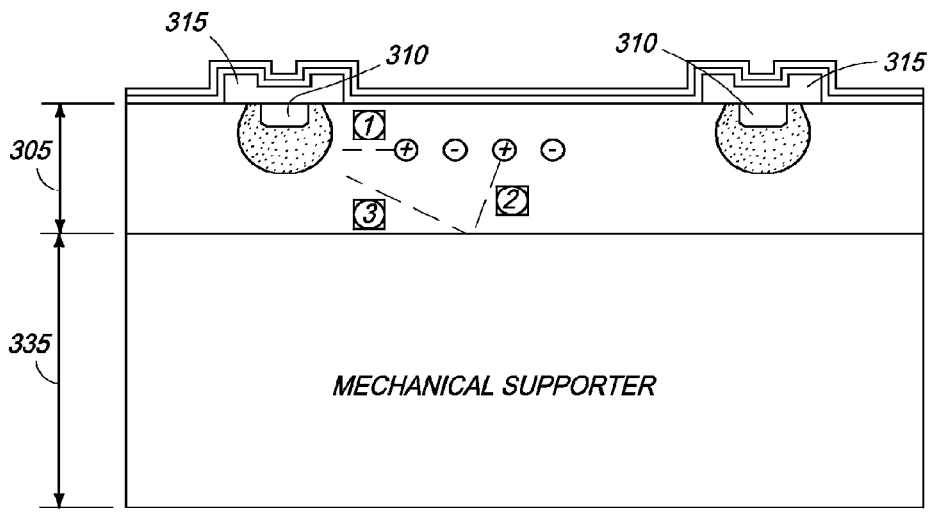
FIG. 3B represents a cross-sectional view of an embodiment of the fishbone photodiode fabricated in accordance with the present invention.
Figure 3C:
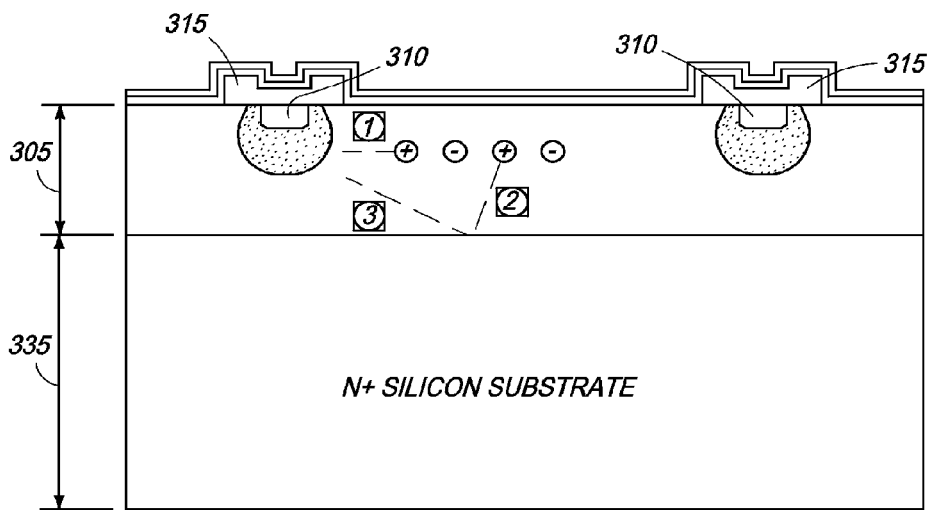
FIG. 3C represents a cross-sectional view of an embodiment of the fishbone photodiode fabricated in accordance with the present invention.

FIGS. 3A, 3B, and 3C represent cross-sectional views of various embodiments of the fishbone photodiode fabricated in accordance with the present invention. Now referring to FIG. 3A, in one embodiment, the photodiode array 300 of the present invention is fabricated on thin active layer 305. In one embodiment, thin active layer 305 has a thickness of 15 μm. The thin active layer results in a decrease in the leakage or dark current of the device, because the dark current is proportional to the volume of the active layer of the device. As shown in FIG. 3A, quantum efficiency is retained because photo-generated holes 320 need move only a short distance or path 325 before getting collected by depletion region 330. In one embodiment, depletion region 330 has a surface width of 5 μm.

In one embodiment, the photodiode array of the present invention comprises a p+ fishbone pattern, wherein adjacent p+ fishbones 310 are placed at a wide distance from each other, necessitating the use of fewer fishbones than the conventional fishbone photodiode array described above. In one embodiment, the distance between adjacent fishbones 310 is 700 μm. In one embodiment, the distance between the centers of two adjacent fishbones 310, or pitch, is 714 μm.

In another embodiment, the fishbone photodiode of the present invention is fabricated with a thick oxide region 315 on top of each of the P-N junctions prior to the growth/ deposition of the relatively thin anti-reflective (AR) layers 341, 342. In one embodiment, thick oxide regions 315 comprise approximately 8000 Å of silicon oxide and approximately 425 A of silicon nitride. In one embodiment, the thick oxide regions or layer 315 comprises three sections 315a, 315b, and 315c. Sections 315a and 315b comprise the end sections of thick oxide regions or layer 315 and have a width of 20 µm. Section 315c is the middle section of thick oxide regions 315, directly on top of the p+ fishbone, and, in one embodiment, is thinner than end sections 315a and 315b. Since the P-N junctions are passivated with the thick oxide regions 315, the device has more structural rigidity and integrity and is less prone to junction degradation.

In one embodiment of the photodiode array of the present invention, AR layer 341 comprises silicon oxide and has a thickness of 150 Å. In one embodiment, AR layer 342 comprises silicon nitride and has a thickness of 425 Å.

Now referring to FIG. 3B, in one embodiment, the present invention is a fishbone photodiode device that can be fabricated on a thin active layer 305, wherein the thin active layer 305 is placed on a mechanical support 335 for added strength and durability. In one embodiment, mechanical support 335 comprises CZ silicon, FZ silicon, quartz, or any other similar mechanical support material that does not affect device performance characteristics. In one embodiment, the mechanical support 335 has a thickness of 250 µm. In one embodiment, and now referring to FIG. 3C, the mechanical support 335 is n+ silicon substrate.

FIGS. 4A through 4I depict side planar views of manufacturing steps for fabricating the fishbone photodiode 400 of the present invention, as shown in FIG. 3C, where a n+ silicon substrate mechanical support is employed. It should be understood to those of ordinary skill in the art that while the method of manufacturing the fishbone photodiode of the present invention is described with respect to the use of the mechanical support, the mechanical support is optional and the manufacturing steps can be employed without the support.

Modifications or alterations to the manufacturing steps, their corresponding details, and any order presented may be readily apparent to those of ordinary skill in the art. Thus, the present invention contemplates many possibilities for manufacturing the photodiode array of the present invention and is not limited to the examples provided herein.

Referring now to FIG. 4A, the starting material for fabricating photodiode 400 is, in one embodiment, thin active layer 405 on n+ silicon substrate wafer 410. Thin active layer 405 is preferably silicon, n-type, and has a resistivity of approximately 1,000 Ωcm. In one embodiment, the thin active layer is thin epi or a thin direct-bonded active layer. In one embodiment, thin active layer 405 has a thickness of 15 µm. In one embodiment, the n+ silicon substrate wafer 410 has a thickness of 250 µm. In one embodiment, the overall thickness of the starting material is 265 µm. While it is preferred that the substrate wafer be comprised of silicon, one of ordinary skill in the art would appreciate that any suitable mechanical support, which can be processed in accordance with the processing steps of the present invention, may be used.

In addition, both thin active layer 405 and substrate wafer 410 can optionally be polished on both sides to allow for greater conformity to parameters, surface flatness, and specification thickness. It should be understood by those of ordinary skill in the art, however, that the above specifications are not binding and that the type of material and resistivity can easily be changed to suit the design, fabrication, and functional requirements of the present invention.

Referring back to FIG. 4A, in step 450, both thin active layer 405 and n+ silicon substrate 410 are subjected to a standard mask oxidation process that grows an oxide layer 415 on the front side of thin active layer 405 and the back side of n+ silicon substrate 410. In one embodiment, the oxide layer 415 comprises silicon oxide ($SiO_2$) having a thickness of approximately 8000 Å. The thick oxide layer 415 will serve to protect the P-N junction, as described with respect to FIGS. 2 and 3a. In one embodiment, thermal oxidation is employed to achieve mask oxidation. Standard mask oxidation is well known to those of ordinary skill in the art and will not be described in further detail herein.

Now referring to FIG. 4B, after the standard mask oxidation is complete, in step 455, the device is subjected to n+ photolithography on the front side of thin active layer 405. In one embodiment, photolithography comprises employing a photoresist layer to create a specific pattern on the surface of thin active layer 405.

Generally, the photoresist layer is a photosensitive polymeric material for photolithography and photoengraving that can form a patterned coating on a surface. After selecting a suitable material and creating a suitable photoresist pattern, a thin photoresist layer is applied to the front side of thin active layer 405. In one embodiment, the photoresist layer is applied via a spin coating technique. Spin coating is well known to those of ordinary skill in the art and will not be described in detail herein.

Figure 5A:
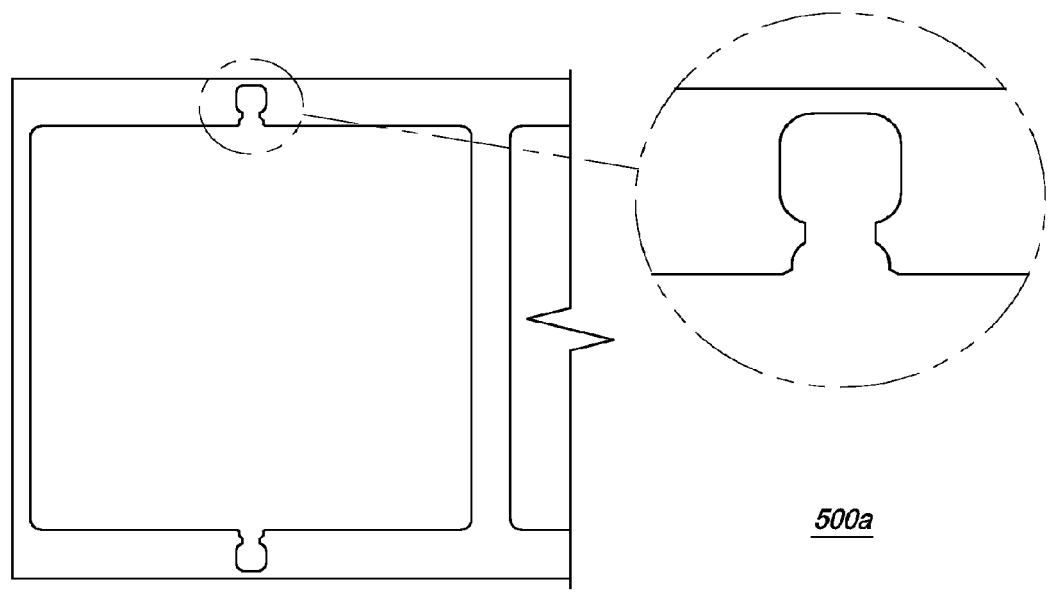
FIG. 5A depicts an exemplary embodiment of an n+ mask used during manufacturing the fishbone photodiode of the present invention.

In one embodiment, n+ masking is used to form a suitable photoresist layer pattern. An exemplary n+ mask is shown in FIG. 5A. As shown in FIG. 5A, the n+ masking results in a specific pattern on thin active layer 405. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask shown in FIG. 5A comprises a plurality of diffusion windows with appropriate geometrical and dimensional specifications.

Referring back to FIG. 4B, the photoresist coated thin active layer 405 is aligned with the n+ mask and appropriately treated to reveal n+ diffusion regions. An intense light, such as UV light, is projected through the mask, exposing the photoresist layer in the pattern of the n+ mask. The n+ mask allows selective irradiation of the photoresist on the thin active layer. Regions that are exposed to radiation are hardened while those that are reserved for diffusion remain shielded by the n+ mask and easily removed by etching.

The exposed and remaining photoresist is then subjected to a suitable chemical or plasma etching process to reveal the pattern transfer from the mask to the photoresist layer. The etching process is employed to remove the silicon oxide layer from the front side of the thin active layer and the back side of the n+ substrate. In one embodiment, the pattern of the photoresist layer and/or n+ mask defines a plurality of regions 420, on the front side of the thin active layer, devoid of the oxide layer deposited in step 450 and ready for n+ diffusion.

Now referring to FIG. 4C, in step 460, the front side of thin active layer 405 and the back side of n+ silicon substrate 410 are subjected to n+ diffusion followed by drive-in oxidation. Generally, diffusion facilitates propagation of a diffusing material through a host material. In step 460, an appropriate amount of dopant atoms, such as phosphorous, is deposited onto at least a portion of the front side of thin active layer 405 and the entire back side of the n+ silicon substrate 410. The substrate is then subjected to a drive-in oxidation process that is used to redistribute the dopant atoms and deposit them deeper into the front side of thin active layer 405 and back side of silicon substrate 410. In one embodiment, this process fills the plurality of regions 420 devoid of the oxide layer via deep diffusion with n+ dopant. In addition, exposed surfaces, such as the front side of thin active layer 405 and back side of silicon substrate 410, are covered with oxide layer 425. In one embodiment, oxide layer 425 has a thickness of approximately 3000 Å.

Referring now to FIG. 4D, in step 465, the front side of thin active layer 405 is subjected to a p+ lithography process, creating a plurality of regions 430, which are exposed silicon surfaces devoid of any layers. As with any conventional lithography process, p+ lithography comprises at least the following tasks, but not limited to such tasks: substrate preparation; photoresist application; soft baking; mask alignment; exposure; development; hard backing; and etching. In addition, various other chemical treatments may be performed.

Figure 5B:
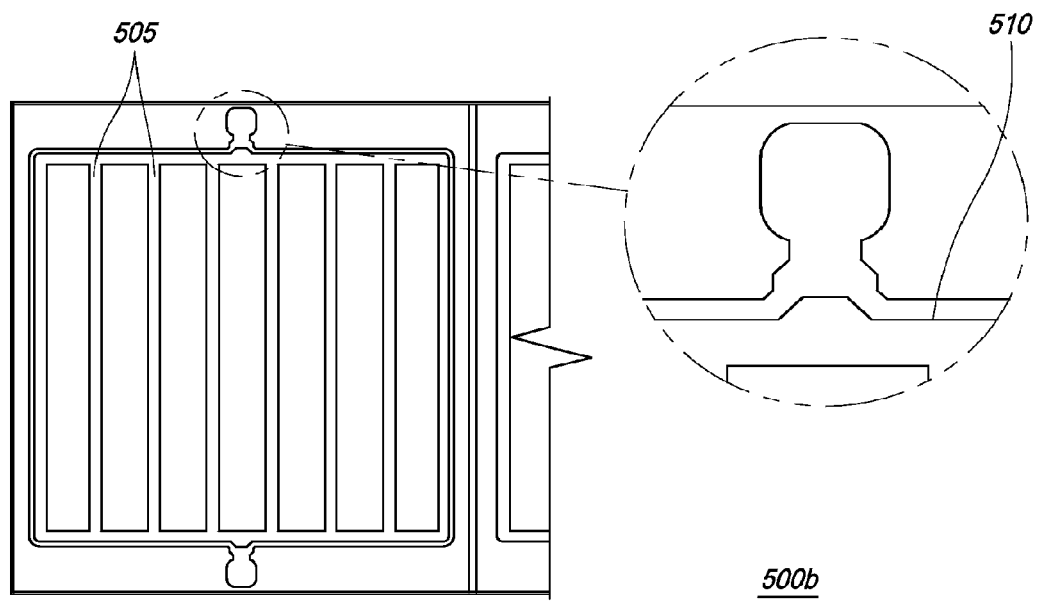
FIG. 5B depicts an exemplary embodiment of a p+ mask used during manufacturing the fishbone photodiode of the present invention.

In one embodiment, the p+ mask shown in FIG. 5b is employed. In one embodiment, the p+ mask pattern is a fishbone pattern that comprises p+ bones 505, further defined by a periphery frame bone 510. In one embodiment, bones 505 have a width of 0.014 mm. In one embodiment, the distance between adjacent p+ bones is 700 µm. In one embodiment, the pitch is 714 µm. The p+ masking process is similar to that delineated with respect to the n+ masking process described earlier and will not be repeated in detail herein.

The p+ masking process further comprises deposition and drive-in oxidation, as shown in FIG. 4e, allowing for predefined and/or predetermined thermal budget in accordance with the principles of the present invention. Now referring to FIG. 4E, in step 470, an appropriate amount of dopant atoms, such as boron, is deposited onto at least a portion of the front side of thin active layer 405. The thin active layer 405 is then subjected to a drive-in oxidation process that is used to redistribute the dopant atoms and deposit them deeper into the front side of thin active layer 405. In one embodiment, this process fills the plurality of regions 430 devoid of the oxide layer via deep diffusion with p+ dopant. In one embodiment, the p+ regions have a width of 0.014 mm. In one embodiment, the distance between adjacent p+ bones is 700 µm. In one embodiment, the pitch, or distance between the centers of any two adjacent p+ bones, is 714 µm.

In addition, exposed surfaces, such as the front side of thin active layer 405 and back side of silicon substrate 410, are covered with an oxide layer 431. In one embodiment, oxide layer 431 has a thickness of approximately 2700 Å.

In step 475, as shown in FIG. 4F, the device wafer undergoes active area photolithography and subsequent selective oxide etching to expose a plurality of active area regions 435 on the front side of thin active layer 405. In one embodiment, an active area mask, such as that shown in FIG. 5C is employed. The active area specifications, among other parameters, form the significant performance characteristics of the photodiode of the present invention.

Referring back to FIG. 4F, a plurality of thick oxide covered regions 440 are retained on top of the P-N junction. In one embodiment, thick oxide regions 440 comprise approximately 8000 Å of silicon oxide and approximately 425 Å of silicon nitride. In one embodiment, the thick oxide regions or layer 440 comprises three sections 440a, 440b, and 440c. Sections 440a and 440b comprise the end sections of thick oxide regions or layer 440 and have a width of 20 mm. Section 440c is the middle section of thick oxide regions 440, directly on top of the p+ fishbone, and, in one embodiment, is thinner than end sections 440a and 440b. Since the P-N junctions are passivated with the thick oxide regions 440, the device has more structural rigidity and integrity and is less prone to junction degradation.

In one embodiment, the back side of the n+ silicon substrate 410 is etched completely so that it is devoid of any oxide layer.

In step 480, as shown in FIG. 4G, dual anti-reflective (AR) layers 441 and 442 are grown on the front side of thin active layer 405 and silicon substrate 410. Persons of ordinary skill in the art would appreciate that various anti-reflective coating designs, such as 1 layer, 2 layer, 3 layer, and 4+ layer may be employed. By way of example, and by no means limiting, the dual layer anti-reflective coating design adopted herein utilizes a combination of thin film materials, such as oxides, sulfides, fluorides, nitrides, selenides, and metals, among others. In one embodiment of the photodiode array of the present invention, AR layer 441 comprises silicon oxide and has a thickness of 150 Å. In one embodiment, AR layer 442 comprises silicon nitride and has a thickness of 425 Å.

Although the thickness of the AR layers of the present invention are optimized for use with LSO/LYSO scintillator crystals, it should be appreciated by those of ordinary skill in the art that the thickness of the AR layer employed in the present invention can be tailored to obtain minimum reflection loss at different wavelengths for different applications and can thus be used with any scintillator material.

For example, but not limited to such example, certain photodiode arrays employ a scintillator material such as Cadmium Tungstate. Cadmium Tungstate ($CdWO_4$ or CWO) is a dense, chemically inert solid which is used as a scintillation crystal to detect gamma rays. The crystal is transparent and emits light when it is hit by gamma rays and X-rays, making it useful as a detector of ionizing radiation. Its peak scintillation wavelength is 520 nm (with emission range between 330-540 nm), and efficiency of 13000 photons/MeV.

Now referring to FIG. 4H, in step 485, a contact etch mask is used to etch a plurality of contact windows 445 into the front side of the thin active layer 405. Contact lithography, well known to those of ordinary skill in the art, involves printing an image or pattern via illumination of a photomask in direct contact with a substrate coated with an imaging photoresist layer. Typically, a contact window is an aperture defined in a surface passivation layer through which device metallization develops contact with circuit elements. The contact windows 445 formed on the front side of the thin active layer 405 by using standard semiconductor technology photolithography techniques. The contact window oxide can then be removed by either standard wet or standard dry etching techniques as are well known to those of ordinary skill in the art.

Figure 5C:
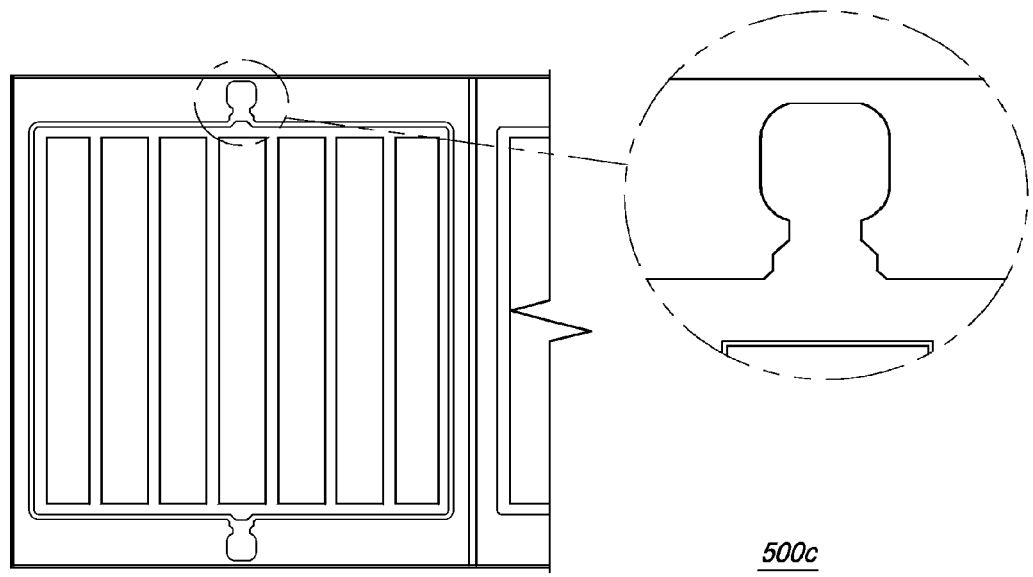
FIG. 5C depicts an exemplary embodiment of an active area mask used during manufacturing the fishbone photodiode of the present invention.
Figure 5D:
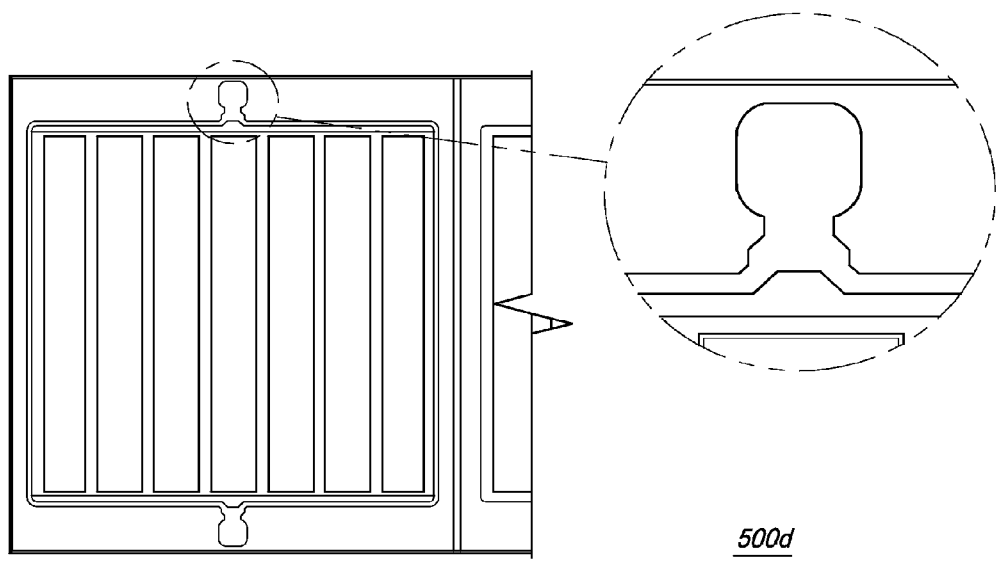
FIG. 5D depicts an exemplary embodiment of a contact mask used during manufacturing the fishbone photodiode of the present invention.

More specifically, and not limited to such example, in one embodiment of the photodiode array of the present invention, a contact window mask such as that shown in FIG. 5D is first applied. In one embodiment, the contact window mask is a dark field mask, which is used to remove the silicon oxide layer in regions requiring contacts. Using the contact mask, at least one of contact windows 445 is opened through the protective and passivation layers deposited on the surface of the thin active layer by etching the oxide from regions 445 that remain exposed by the mask. In one embodiment, contact window etching is achieved via a chemical etching process, wherein the wafer is immersed in buffered oxide etch (BOE), a HF acid-based solution for intervals sufficient to remove the layers exposed by the contact window mask.

Figure 4I:
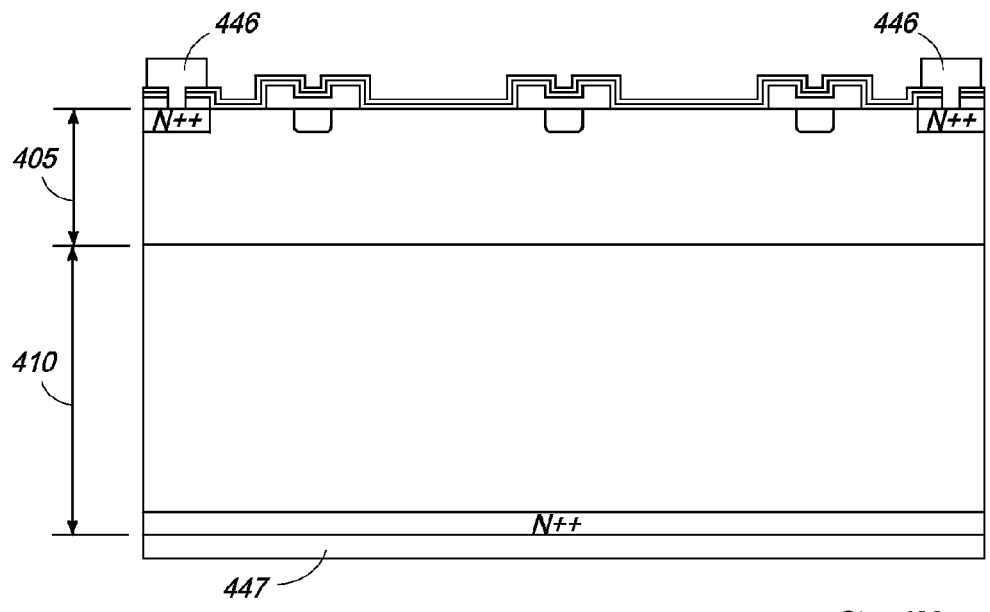
FIG. 4I depicts a cross-sectional, planar view of a manufacturing step for fabricating the fishbone photodiode of the present invention, shown in FIG. 3A.

Referring now to FIG. 4I, in step 490, thin active layer 405 and n+ silicon substrate 410 are subjected to a metal deposition process to provide metal contacts 446 on the front side of thin active layer 405 and a metal layer 447 on the back side of the n+ silicon substrate wafer for creating electrical connections. In the metal deposition process, also called metallization, metal layers are deposited on the wafer to create conductive pathways. The most common metals include aluminium, nickel, chromium, gold, germanium, copper, silver, titanium, tungsten, platinum, and tantalum. Selected metal alloys may also be used. Metallization is often accomplished with a vacuum deposition technique. The most common deposition process include filament evaporation, electron-beam evaporation, flash evaporation, induction evaporation, and sputtering, followed by metal masking and selective etching.

Figure 5E:
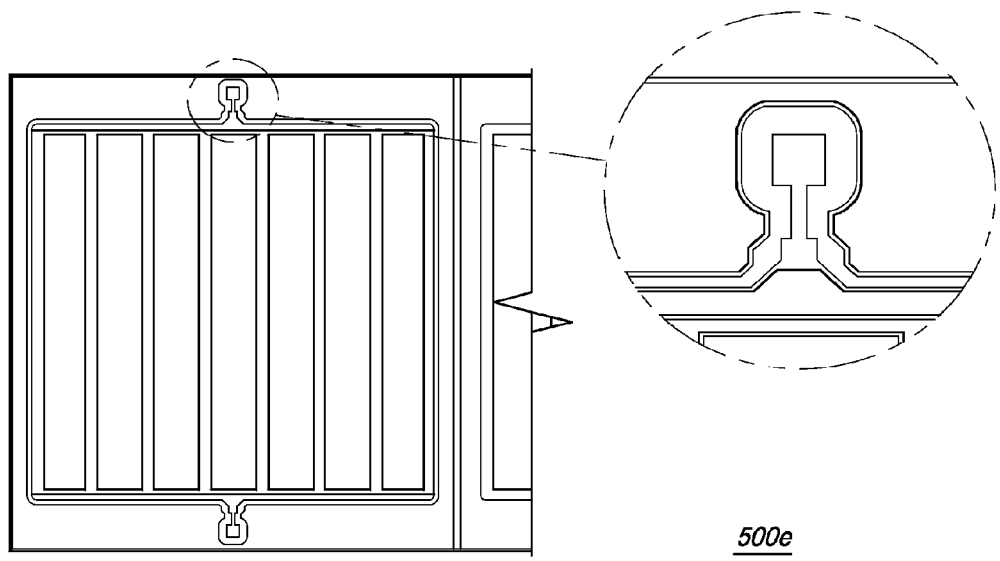
FIG. 5E depicts an exemplary embodiment of a metal mask used during manufacturing the fishbone photodiode of the present invention.

In one embodiment, the metal mask shown in FIG. 5E is employed. In one embodiment, metal contacts 446 are selectively etched on the front side of the photodiode 400 using the metal mask shown in FIG. 5E. Metal etching can be performed in a variety of methods, including, but not limited to abrasive etching, dry etching, electroetching, laser etching, photo etching, reactive ion etching (RIE), sputter etching, and vapor phase etching.

FIGS. 6A, 6B, 6C, 6D, and 6E illustrate various alternative embodiments of a fishbone photodiode array, wherein each photodiode element comprises at least one p+ fishbone, and preferably, at least three p+ fishbones. It should be noted that while the embodiments described herein depict various p+ bone layout designs for an exemplary photodiode array 600 comprising four anode pads 615 on the front side and common cathode metallization (not shown) on the back side, any number of photodiode elements may be used to form a photodiode array.

In the examples described below, the photodiode array 600 shown in FIGS. 6A through 6E are, in one embodiment, fabricated on silicon chips having a thickness of 0.250 mm and have overall dimensions of 22.254 mm×6.594 mm and a tolerance of +−0.025 mm.

Figure 6A:
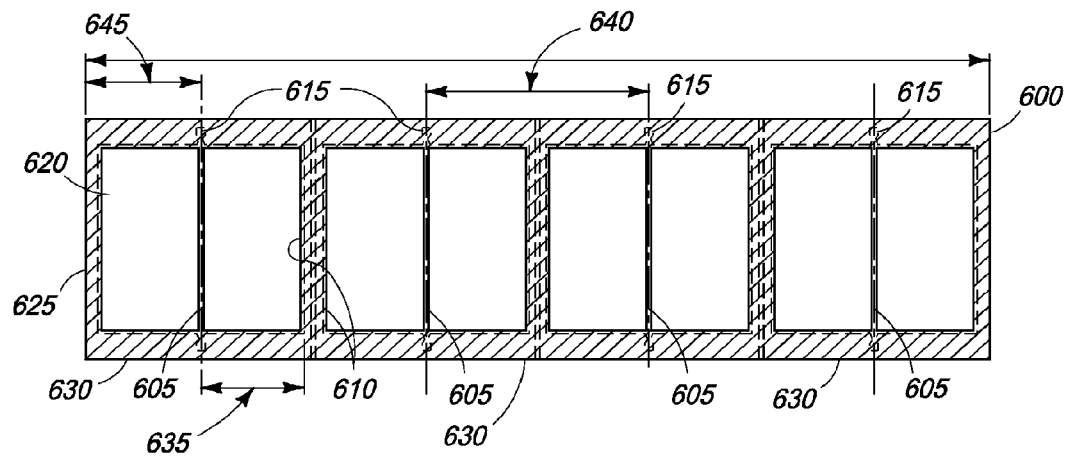
FIG. 6A represents a front-side view of one embodiment of the fishbone photodiode array of the present invention, wherein each photodiode element comprises a three p+ bone layout.

FIG. 6A represents a front-side view of one embodiment of the fishbone photodiode array 600 of the present invention, wherein each photodiode element comprises a three p+ bone layout. A p+ mask is employed to create and form the three p+ fishbone pattern, comprising p+ bones 605 further defined by periphery frame bones 610. Thus, each of the four photodiode elements 630 comprises three fishbones. In this embodiment, the distance 635 from the center of one p+ diffusion bone 605 to the center of the adjacent periphery frame bone 610, defining the bones pitch, is 2.493 mm. The distance 640 between the centers of any two adjacent elements or anode pads 615 is 5.600 mm. The photodiode array 600 further comprises active areas 620 which in this example are 5 mm×5 mm each. Also, the distance 645 between anode pads 615 and edge, such as edge 625, of the corresponding photodiode is 2.727 mm.

Figure 6B:
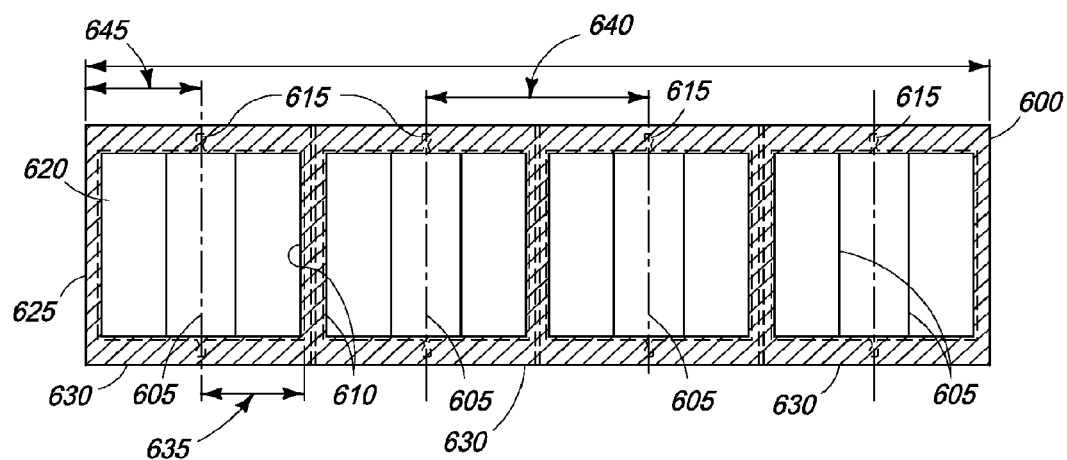
FIG. 6B represents a front-side view of one embodiment of the fishbone photodiode array of the present invention, wherein each photodiode element comprises a four p+ bone layout.

FIG. 6B represents a front-side view of one embodiment of the fishbone photodiode array 600 of the present invention, wherein each photodiode element comprises a four p+ bone layout. A p+ mask is employed to create and form the four p+ fishbone pattern, comprising p+ bones 605 further defined by periphery frame bones 610. Thus, each of the four photodiode elements 630 comprises four fishbones. In this embodiment, the distance 635 from the center of one p+ diffusion bone 605 to the center of the adjacent bone 605 or 610, defining the bones pitch, is 1.662 mm. The distance 640 between the centers of any two adjacent elements 630 or anode pads 615 is 5.600 mm. The photodiode array 600 further comprises active areas 620 which in this example are 5 mm×5 mm each. Also, the distance 645 between anode pads 615 and edge, such as edge 625, of the corresponding photodiode is 2.727 mm.

Figure 6C:
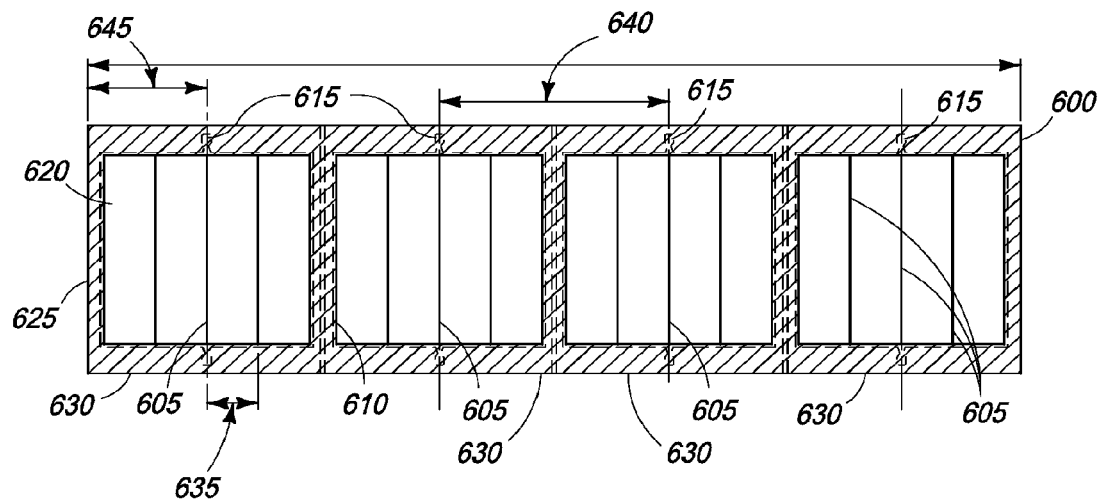
FIG. 6C represents a front-side view of one embodiment of the fishbone photodiode array of the present invention, wherein each photodiode element comprises a five p+ bone layout.

FIG. 6C represents a front-side view of one embodiment of the fishbone photodiode array 600 of the present invention, wherein each photodiode element comprises a five p+ bone layout. A p+ mask is employed to create and form the five p+ fishbone pattern, comprising p+ bones 605 further defined by periphery frame bones 610. Thus, each of the four photodiode elements 630 comprises five fishbones. In this embodiment, the distance 635 from the center of one p+ diffusion bone 605 to the center of the adjacent bone 605 or 610, defining the bones pitch, is 1.247 mm. The distance 640 between the centers of any two adjacent elements 630 or anode pads 615 is 5.600 mm. The photodiode array 600 further comprises active areas 620 which in this example are 5 mm×5 mm each. Also, the distance 645 between anode pads 615 and edge, such as edge 625, of the corresponding photodiode is 2.727 mm.

Figure 6D:
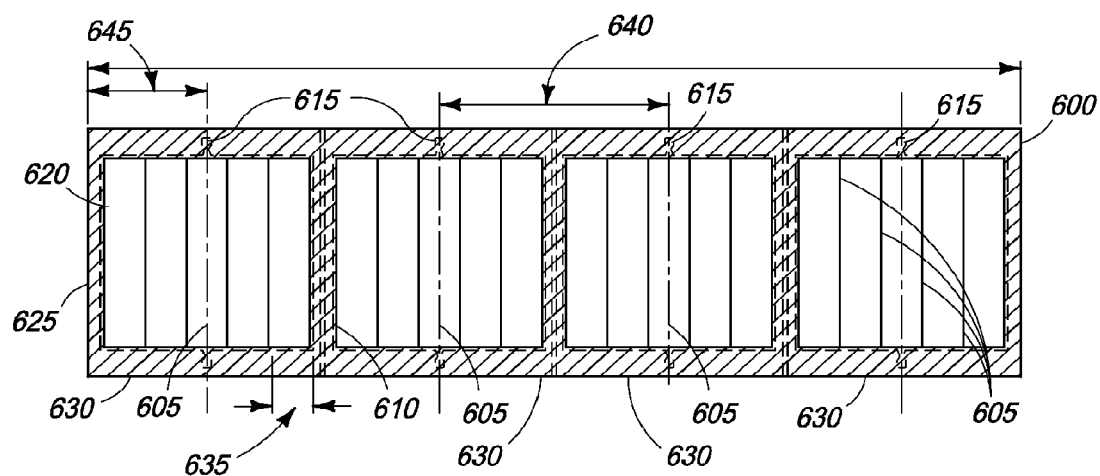
FIG. 6D represents a front-side view of one embodiment of the fishbone photodiode array of the present invention, wherein each photodiode element comprises a six p+ bone layout.

FIG. 6D represents a front-side view of one embodiment of the fishbone photodiode array 600 of the present invention, wherein each photodiode element comprises a six p+ bone layout. A p+ mask is employed to create and form the six p+ fishbone pattern, comprising p+ bones 605 further defined by periphery frame bones 610. Thus, each of the four photodiode elements 630 comprises six fishbones. In this embodiment, the distance 635 from the center of one p+ diffusion bone 605 to the center of the adjacent bone 605 or 610, defining the bones pitch, is 0.997 mm. The distance 640 between the centers of any two adjacent elements 630 or anode pads 615 is 5.600 mm. The photodiode array 600 further comprises active areas 620 which in this example are 5 mm×5 mm each. Also, the distance 645 between anode pads 615 and edge, such as edge 625, of the corresponding photodiode is 2.727 mm.

Figures 6E, 7:
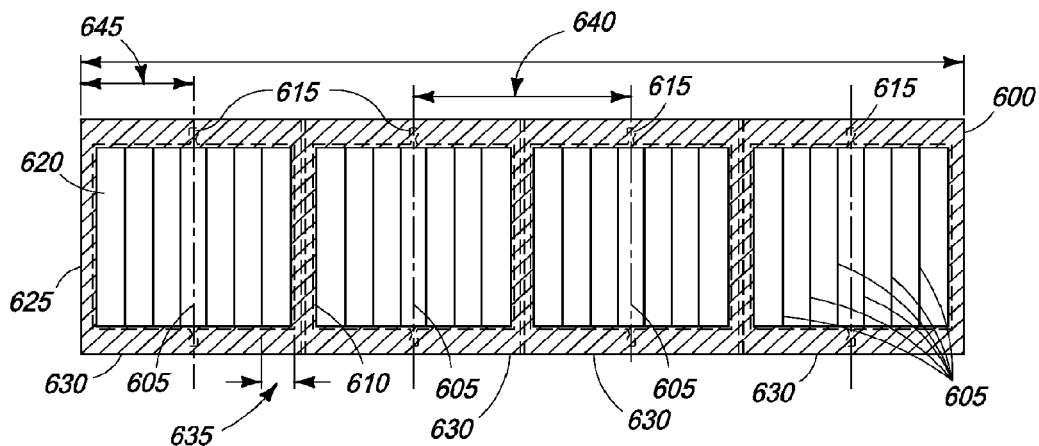
FIG. 6E represents a front-side view of one embodiment of the fishbone photodiode array of the present invention, wherein each photodiode element comprises an eight p+ bone layout.
FIG. 7 is a table depicting example performance characteristics for each of the three, four, five, six and eight bone layout design arrays of FIGS. 6A through 6E at a particular bias voltage.

FIG. 6E represents a front-side view of one embodiment of the fishbone photodiode array 600 of the present invention, wherein each photodiode element comprises an eight p+ bone layout. A p+ mask is employed to create and form the eight p+ fishbone pattern, comprising p+ bones 605 further defined by periphery frame bones 610. Thus, each of the four photodiode elements 630 comprises eight fishbones. In this embodiment, the distance 635 from the center of one p+ diffusion bone 605 to the center of the adjacent bone 605 or 610, defining the bones pitch, is 0.712 mm. The distance 640 between the centers of any two adjacent elements 630 or anode pads 615 is 5.600 mm. The photodiode array 600 further comprises active areas 620 which in this example are 5 mm×5 mm each. Also, the distance 645 between anode pads 615 and edge, such as edge 625, of the corresponding photodiode is 2.727 mm.

FIG. 7 is a table depicting example performance characteristics for each of the three, four, five, six and eight bone layout design arrays of FIGS. 6A through 6E at a particular bias voltage. This table provides performance characteristics for the various layouts at 10 mV bias voltage and 540 nm flooded. For example, the four bones design array of FIG. 6B can achieve characteristics of Rsh typ 2 Gohm, capacitance typ 34.8 pF @ 0 volt, responsivity typ 0.385 A/W @ 540 nm, response time typ 179 uS.

FIG. 8 is another table depicting example performance characteristics for each of the three, four, five, six and eight bones layout design arrays of FIGS. 6A through 6E at three different bias voltages. Thus, this table provides performance characteristics for each of the bone design layouts (of FIGS. 6A through 6E) at three bias voltages of 0.01V, 1.5V and 3V respectively for 632 nm flooded.

FIG. 11 represents a front-side view of another embodiment of the fishbone photodiode array 1100 of the present invention. In this example, but not limited to such example, photodiode array 1100 comprises at least one photodiode element 1130 which in turn, comprises an eight p+ bone layout. In one embodiment, the photodiode array 1100 comprises two elements 1130. As described earlier, it should be noted that the present invention is not limited to the use of eight p+ bones and a larger or smaller number of p+ bones may be employed depending upon the performance requirements of the photodiode array. A p+ mask is employed to create and form the eight p+ fishbone pattern, comprising p+ bones 1105 further defined by periphery frame bones 1110. Thus, each of the two photodiode elements 1130 comprises eight fishbones.

In this embodiment, the anode metal bars are placed only in the last vertical fishbone 1111 of each of the photodiode elements 1130. The last vertical fishbone 1111 is part of the periphery frame bones 1110. Section 1140 shows a magnified view of the last vertical fishbones showing the p+ bone 1111, the metal contact bars 1112 and the contact window 1113. The metal contact bars 1112 are connected to the wire bonding pads 1125. Sections 1150 show magnified views of how the metal bars 1112 at the last vertical fishbones 1111 of the elements 1130 are connected to form the bonding pads 1125 at the end of the second photodiode element. Persons of ordinary skill in the art should appreciate that with anode pads 1125 on the front side and common cathode metallization (not shown) on the back side, any number of such photodiode elements 1130 may be used to form a photodiode array 1100.

Figure 12:
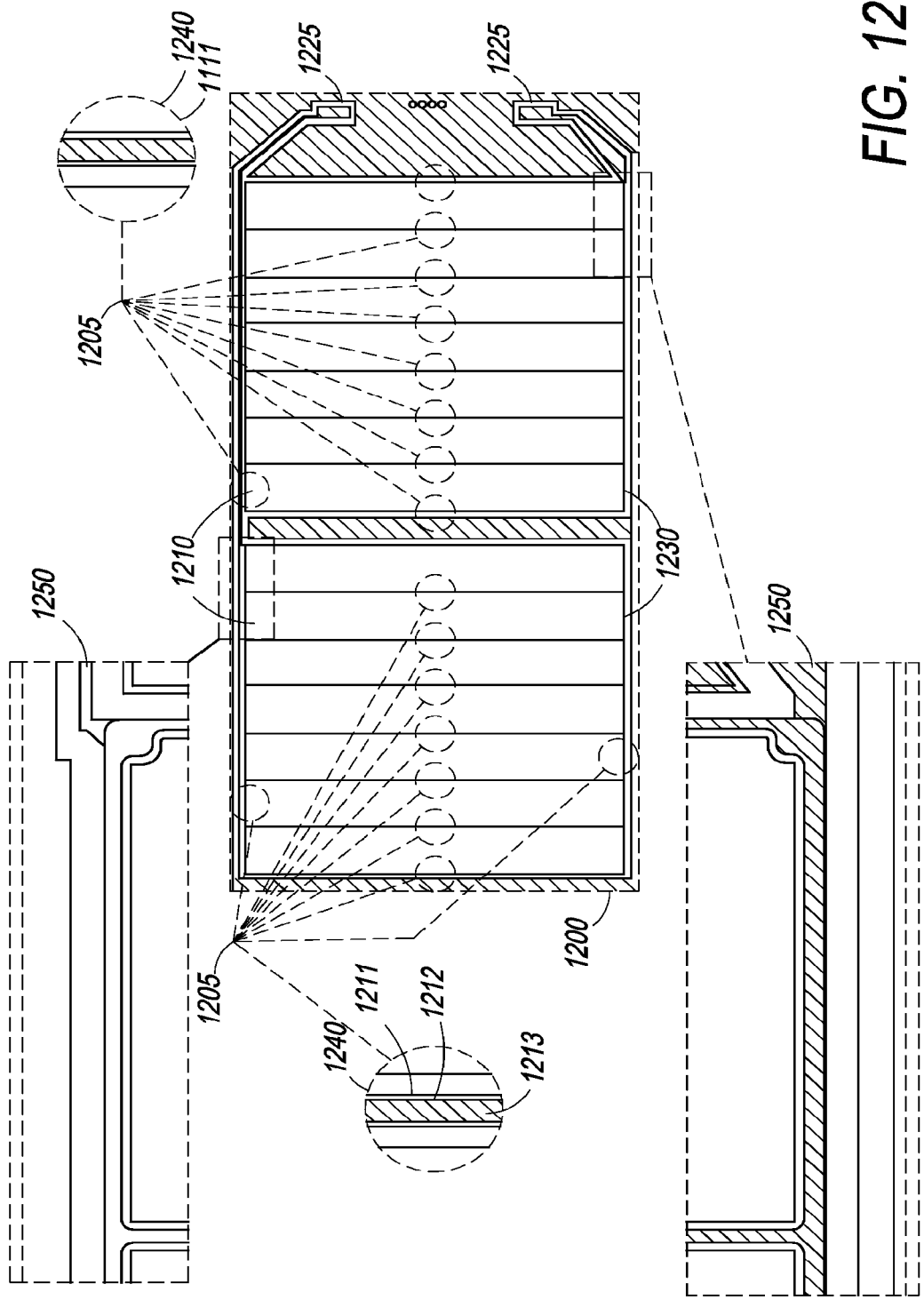
FIG. 12 represents a front-side view of one embodiment of the fishbone photodiode array of the present invention, wherein metal contact bars are placed at each of the fishbone of each of the photodiode elements.

FIG. 12 represents a front-side view of still another embodiment of the fishbone photodiode array 1200 of the present invention. In this example, but not limited to such example, photodiode array 1200 comprises at least one photodiode element 1230 which in turn, comprises a five p+ bone layout. In one embodiment, the photodiode array 1200 comprises two elements 1230. As described earlier, it should be noted that the present invention is not limited to the use of five p+ bones and a larger or smaller number of p+ bones may be employed depending upon the performance requirements of the photodiode array. A p+ mask is employed to create and form the five p+ fishbone pattern, comprising p+ bones 1205 further defined by periphery frame bones 1210. Thus, each of the two photodiode elements 1230 comprises five fishbones.

In this embodiment, the anode metal bars are placed on each of the fishbones (that are five in number in this example)—that is the p+ bones 1205 as well as the periphery bones 1210. Sections 1240 show magnified views of the fishbones comprising the p+ diffusion 1211, the metal contact bars 1212 and the contact window 1213. The metal contact bars 1212, at each of the fishbones, are connected to the wire bonding pads 1225. Sections 1250 show magnified views of how the metal bars 1212 at each of the fishbones 1205, 1210 of the elements 1230 are connected to form the bonding pads 1225 at the end of the second photodiode element. Persons of ordinary skill in the art should appreciate that with anode pads 1225 on the front side and common cathode metallization (not shown) on the back side, any number of such photodiode elements 1230 may be used to form a photodiode array 1200. The photodiode array 1200 with metal bars at each of the fishbones for each of the photodiode elements provides high linear current with low series resistance.

Figure 9A:
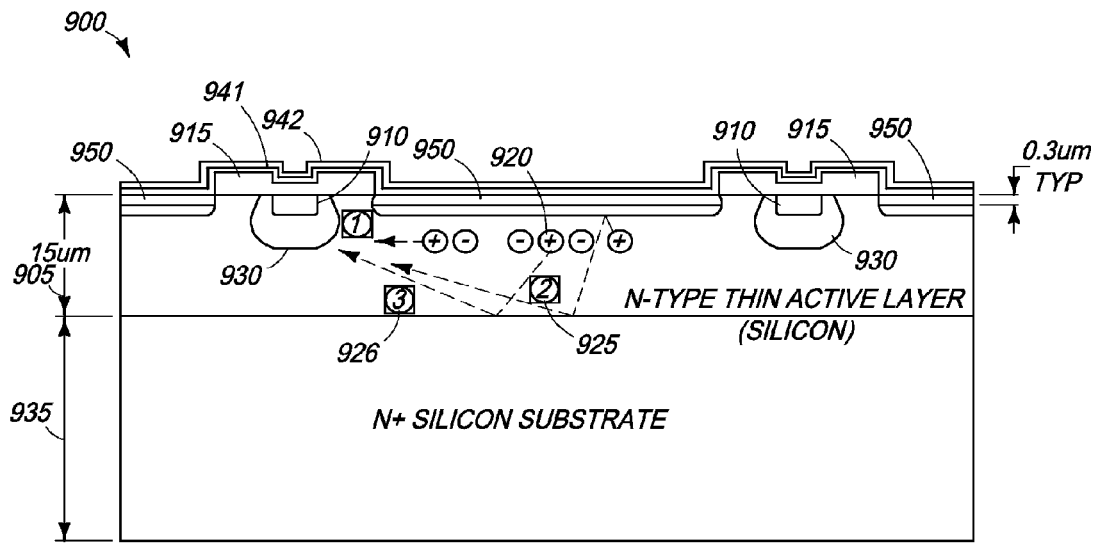
FIG. 9A is a cross-sectional view of an embodiment of the fishbone photodiode fabricated in accordance with the present invention and that additionally uses a shallow n+ layer between adjacent p+ bones.

FIG. 9A is a cross-sectional view of yet another embodiment of the fishbone photodiode 900 fabricated on an n-type thin active layer 905. In one embodiment, thin active layer 905 has a thickness of 15 μm. The thin active layer 905 is placed on a mechanical support 935 comprised of n+ silicon substrate.

The photodiode array 900 comprises a p+ fishbone pattern, wherein adjacent p+ fishbones 910 are placed at a wide distance from each other, necessitating the use of fewer fishbones. The present embodiment, however, also comprises a shallow n+ layer 950 between p+ bones 910. In one embodiment, shallow n+ layer 950 has a depth of 0.3 μm. Since there is no electric field in the wide gap between the p+ bones 910, the photo-generated minority carriers 920, or the holes in n-type silicon, tend to move randomly and thus, in all directions. Holes 920 moving upward are reflected by the n+n high-low junction and finally get collected by the electric field of the PN junction 930 as depicted by path 925. Holes 920 moving downward are reflected by the low-high n-n+ junction at the n-type thin layer/n+ substrate interface and finally also get collected by the PN junction 930 as depicted by path 926. Without the presence of shallow n+ layer 950, a portion of photo-generated minority carriers 920 would otherwise recombine at the silicon/silicon dioxide interface and reduce the charge collection efficiency of device 900. Thus, the shallow n+ layer between p+ bones is advantageous in that it increases the efficiency of the photodiode device.

The fishbone photodiode 900 of FIG. 9A is fabricated with a thick oxide region 915 on top of each of the PN junctions 930 prior to the growth/deposition of the relatively thin anti-reflective (AR) layers 941, 942. In one embodiment, thick oxide regions 915 comprise approximately 8000 Å of silicon oxide and approximately 425 Å of silicon nitride. Since the P-N junctions are passivated with the thick oxide regions 915, the device has more structural rigidity and integrity and is less prone to junction degradation.

In one embodiment AR layer 941 comprises silicon oxide and has a thickness of 150 Å. In one embodiment, AR layer 942 comprises silicon nitride and has a thickness of 425 Å.

Figure 9B:
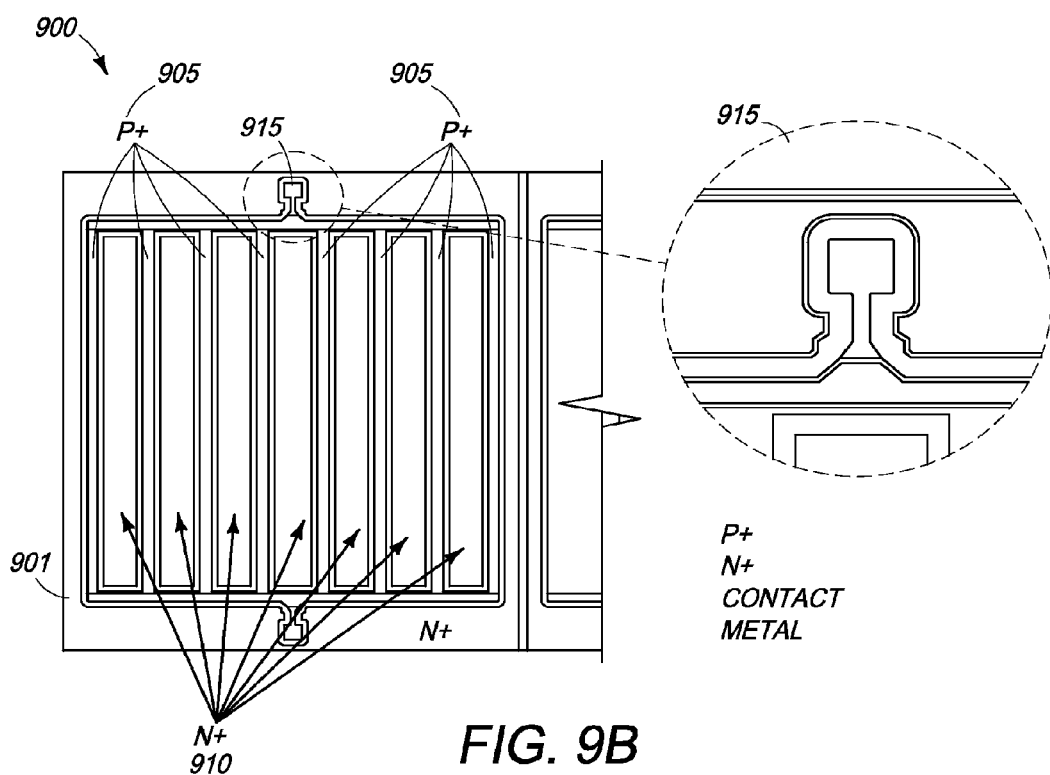
FIG. 9B represent a front-side view of an embodiment of the fishbone photodiode array of the present invention, where shallow n+ layers are formed between adjacent p+ bones.

FIG. 9B shows a front-side view of fishbone photodiode array 900, shown as a cross-sectional view in FIG. 9A. In this example, but not limited to such example, photodiode array 900 comprises at least one photodiode element 901 which in turn, comprises an eight p+ bone layout. As described earlier, it should be noted that the present invention is not limited to the use of eight p+ bones and a larger or smaller number of p+ bones may be employed depending upon the performance requirements of the photodiode array.

A p+ mask is employed to create and form the eight p+ fishbone pattern, comprising p+ bones 905. In addition, an n+ mask is employed to create and form shallow n+ layers 910 between adjacent p+ bones 905. Persons of ordinary skill in the art should appreciate that with anode pads 915 on the front side and common cathode metallization (not shown) on the back side, any number of such photodiode elements 901 may be used to form a photodiode array 900.

FIGS. 10A-10L represent exemplary manufacturing steps of the photodiode of the present invention shown in FIGS. 9A and 9B.

Figure 10A:
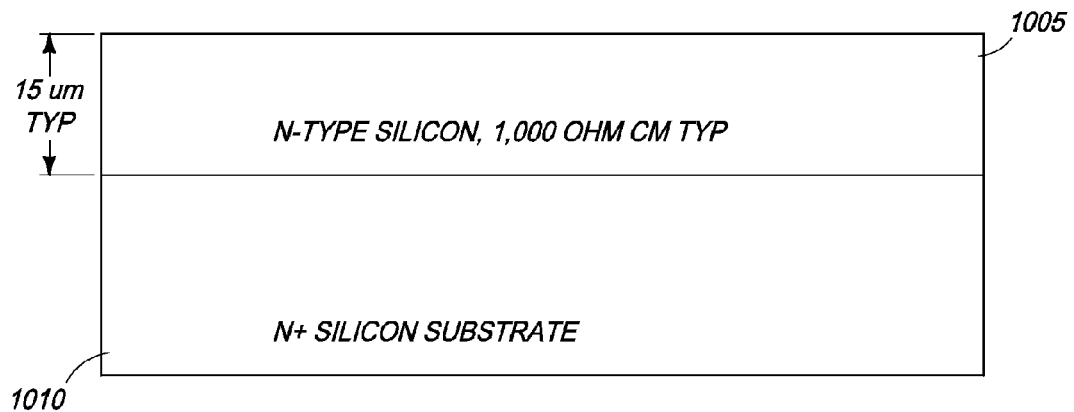
FIG. 10A is an illustration of the starting material used in fabricating the fishbone photodiode array of the present invention, where shallow n+ layers are formed between adjacent p+ bones.

Referring now to FIG. 10A, the starting material for fabricating photodiode 900 of FIGS. 9a and 9b is, in one embodiment, thin active layer 1005 on n+ silicon substrate wafer 1010. Thin active layer 1005 is preferably silicon, n-type, and has a resistivity of approximately 1,000 Ωcm. In one embodiment, the thin active layer 1005 is thin epi or a thin direct-bonded active layer. In one embodiment, thin active layer 1005 has a thickness of 15 μm. In one embodiment, the n+ silicon substrate wafer 1010 has a thickness of 250 μm. In one embodiment, the overall thickness of the starting material is 265 μm. While it is preferred that the substrate wafer be comprised of silicon, one of ordinary skill in the art would appreciate that any suitable mechanical support, which can be processed in accordance with the processing steps of the present invention, may be used.

In addition, both thin active layer 1005 and substrate wafer 1010 can optionally be polished on both sides to allow for greater conformity to parameters, surface flatness, and specification thickness. It should be understood by those of ordinary skill in the art, however, that the above specifications are not binding and that the type of material and resistivity can easily be changed to suit the design, fabrication, and functional requirements of the present invention.

Figure 10B:
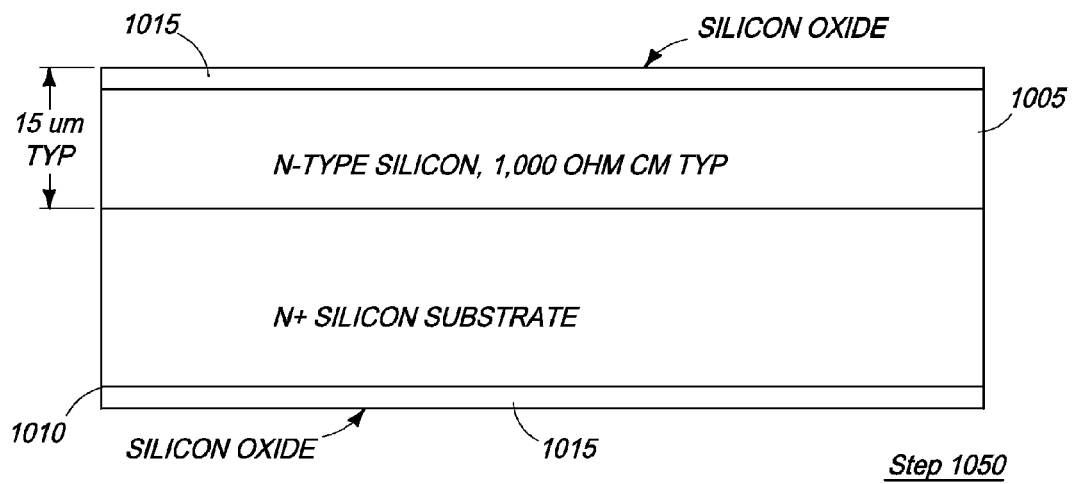
FIG. 10B is a depiction of FIG. 10A, after a mask oxidation step, in one embodiment of the manufacture of the fishbone photodiode array of the present invention, where shallow n+ layers are formed between adjacent p+ bones.

Referring to FIG. 10B, in step 1050, both thin active layer 1005 and n+ silicon substrate 1010 are subjected to a standard mask oxidation process that grows an oxide layer 1015 on the front side of thin active layer 1005 and the back side of n+ silicon substrate 1010. In one embodiment, the oxide layer 1015 comprises silicon oxide (SiO2). The oxide layer 1015 serves to protect the PN junction (that is formed later and described below). In one embodiment, thermal oxidation is employed to achieve mask oxidation. Standard mask oxidation is well known to those of ordinary skill in the art and will not be described in further detail herein.

Figure 10C:
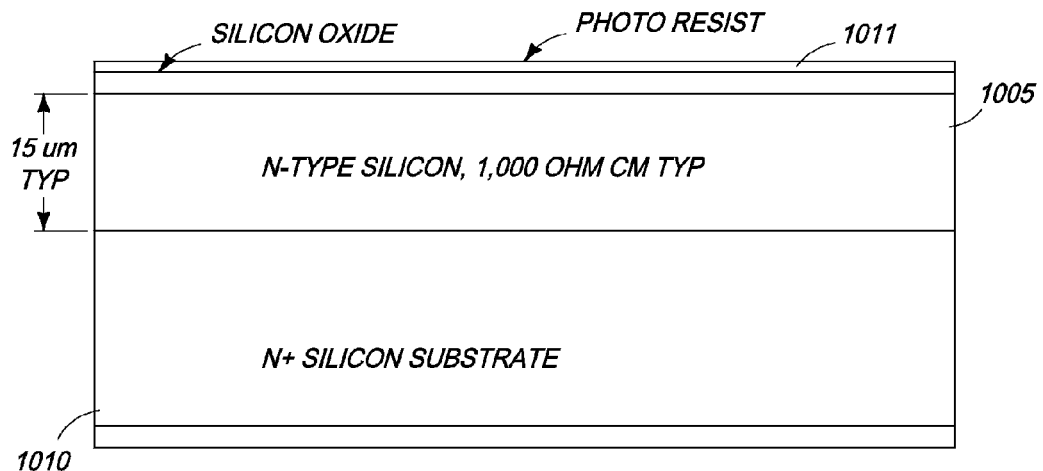
FIG. 10C is an illustration of FIG. 10B, after a p+ lithography step, in one embodiment of the manufacture of the fishbone photodiode array of the present invention, where shallow n+ layers are formed between adjacent p+ bones.

Now referring to FIG. 10C, after the standard mask oxidation is complete, in step 1055, the photodiode device is prepared for p+ photolithography on the front side of thin active layer 1005 by employing a photoresist layer 1011 on the surface of thin active layer 1005. Generally, the photoresist layer is a photosensitive polymeric material for photolithography and photoengraving that can form a patterned coating on a surface. After selecting a suitable material and creating a suitable photoresist pattern, a thin photoresist layer is applied to the front side of thin active layer 1005. In one embodiment, the photoresist layer 1011 is applied via a spin coating technique. Spin coating is well known to those of ordinary skill in the art and will not be described in detail herein.

Figure 10D:
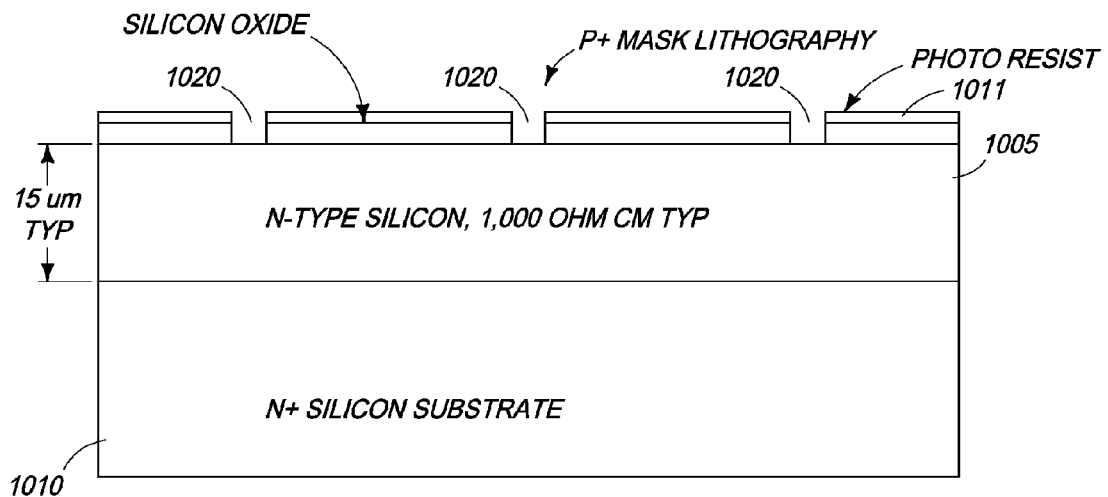
FIG. 10D is an illustration of FIG. 10C, after a p+ masking step, in one embodiment of the manufacture of the fishbone photodiode array of the present invention, where shallow n+ layers are formed between adjacent p+ bones

Referring to FIG. 10D, in step 1060, the photoresist coated thin active layer 1005 is aligned with a suitable p+ mask and appropriately treated to reveal p+ diffusion regions. An intense light, such as UV light, is projected through the mask, exposing the photoresist layer 1011 in the pattern of the p+ mask. The p+ mask allows selective irradiation of the photoresist on the thin active layer. Regions that are exposed to radiation are hardened while those that are reserved for diffusion remain shielded by the p+ mask and easily removed by etching.

The exposed and remaining photoresist is then subjected to a suitable chemical or plasma etching process to reveal the pattern transfer from the mask to the photoresist layer 1011. The etching process is employed to remove the silicon oxide layer from the front side of the thin active layer 1005 and the back side of the n+ substrate 1010. In one embodiment, the pattern of the photoresist layer 1011 and/or p+ mask defines a plurality of regions 1020, on the front side of the thin active layer 1005, ready for p+ diffusion.

Now referring to FIG. 10E, in step 1065, the front side of thin active layer 1005 is subjected to p+ diffusion followed by drive-in oxidation. Generally, diffusion facilitates propagation of a diffusing material through a host material. In step 1065, an appropriate amount of dopant atoms, such as boron, is deposited onto at least a portion of the front side of thin active layer 1005. The substrate is then subjected to a drive-in oxidation process that is used to redistribute the dopant atoms and deposit them deeper into the front side of thin active layer 1005. In one embodiment, this process fills the plurality of regions 1020, devoid of the oxide layer, via deep diffusion with p+ dopant. In one embodiment, the depth of p+ diffusion is of the order of 1 μm. In addition, exposed surfaces of the front side of thin active layer 1005, are covered with oxide layer 1025.

Figure 10G:
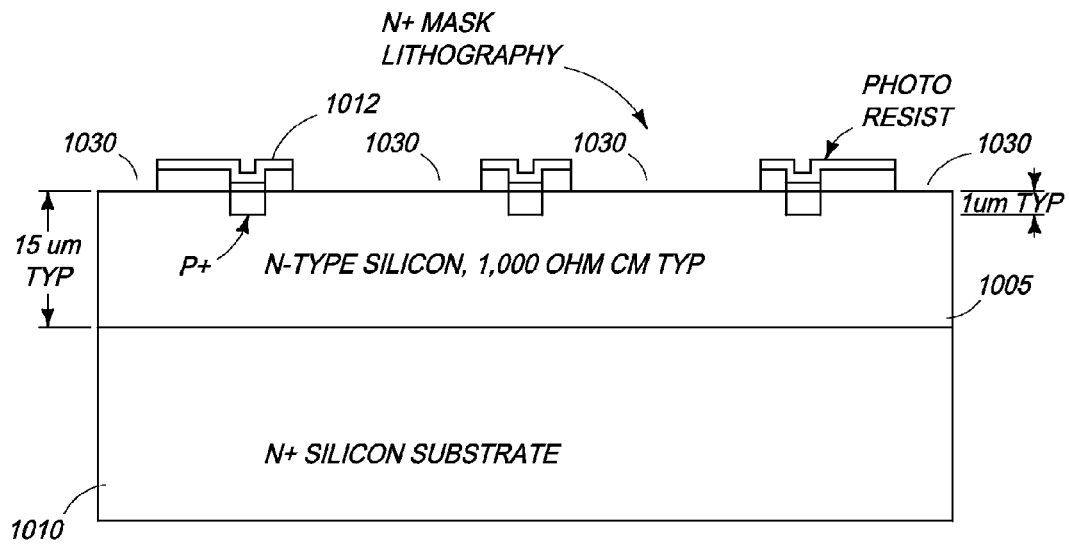
FIG. 10G is an illustration of FIG. 10F, after a n+ masking step, in one embodiment of the manufacture of the fishbone photodiode array of the present invention, where shallow n+ layers are formed between adjacent p+ bones.
Figure 10H:
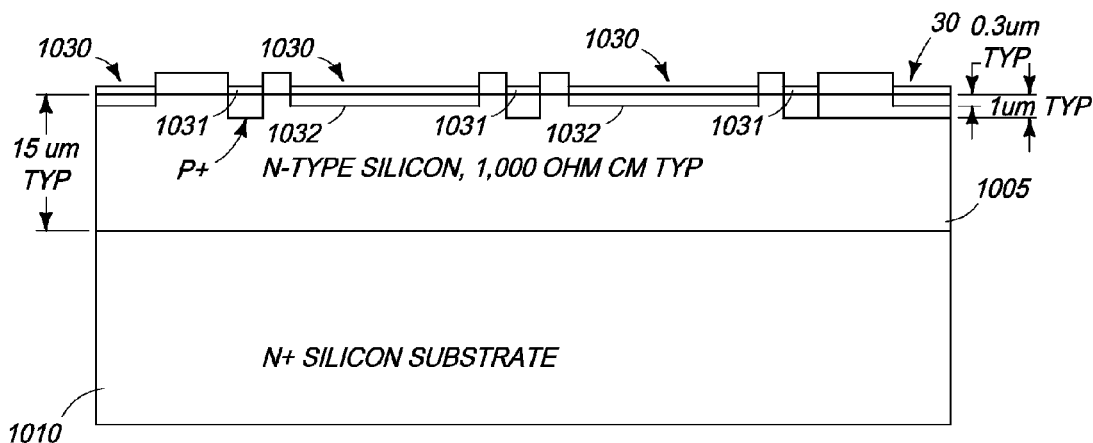
FIG. 10H is an illustration of FIG. 10G, after a doping and drive-in oxidation step, in one embodiment of the manufacture of the fishbone photodiode array of the present invention, where shallow n+ layers are formed between adjacent p+ bones.

In step 1070 of FIG. 10F the front side of the thin active layer 1005 is re-coated with photoresist layer 1012 and prepared for n+ photolithography. Referring now to FIG. 10G, in step 1075, the front side of thin active layer 1005 is aligned with a suitable n+ mask and appropriately treated to reveal n+ diffusion regions 1030. An intense light, such as UV light, is projected through the mask, exposing the photoresist layer 1012 in the pattern of the n+ mask. The n+ mask allows selective irradiation of the photoresist on the thin active layer 1005. Regions that are exposed to radiation are hardened while those that are reserved for diffusion remain shielded by the n+ mask and easily removed by etching.

The exposed and remaining photoresist is then subjected to a suitable chemical or plasma etching process to reveal the pattern transfer from the mask to the photoresist layer 1012. The etching process is employed to remove the silicon oxide layer from the front side of the thin active layer 1005 and the back side of the n+ substrate 1010. In one embodiment, the pattern of the photoresist layer 1012 and/or n+ mask defines a plurality of regions 1030, on the front side of the thin active layer 1005, and ready for n+ diffusion.

The n+ masking process further comprises deposition and drive-in oxidation, allowing for predefined and/or predetermined thermal budget in accordance with the principles of the present invention. Now referring to FIG. 10H, in step 1080, an appropriate amount of dopant atoms, such as phosphorous, is deposited onto at least a portion of the front side of thin active layer 1005. The thin active layer 1005 is then subjected to a drive-in oxidation process that is used to redistribute the dopant atoms and deposit them into the front side of thin active layer 1005. In one embodiment, this process fills the plurality of regions 1030 via shallow diffusion with n+ dopant. In one embodiment, the shallow n+ regions 1032 have a depth of 0.3 μm. In addition, exposed surfaces are covered with an oxide layer 1031. In one embodiment, oxide layer 1031 has a thickness of approximately 150 Å.

Figure 10I:
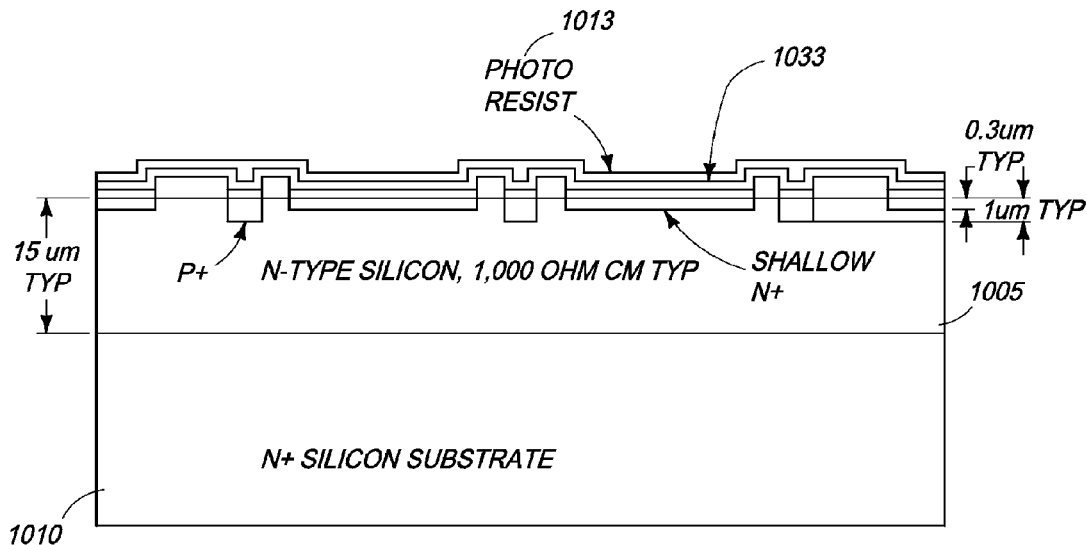
FIG. 10I is an illustration of FIG. 10H, after coating with silicon nitride and photoresist, in one embodiment of the manufacture of the fishbone photodiode array of the present invention, where shallow n+ layers are formed between adjacent p+ bones.

At step 1085 of FIG. 10I the front side of the thin active layer 1005 is coated with a thick layer 1033 of silicon nitride and thereafter with a layer of photoresist material 1013. In one embodiment, the thickness of the silicon nitride layer 1033 is 425 Å.

Figure 10J:
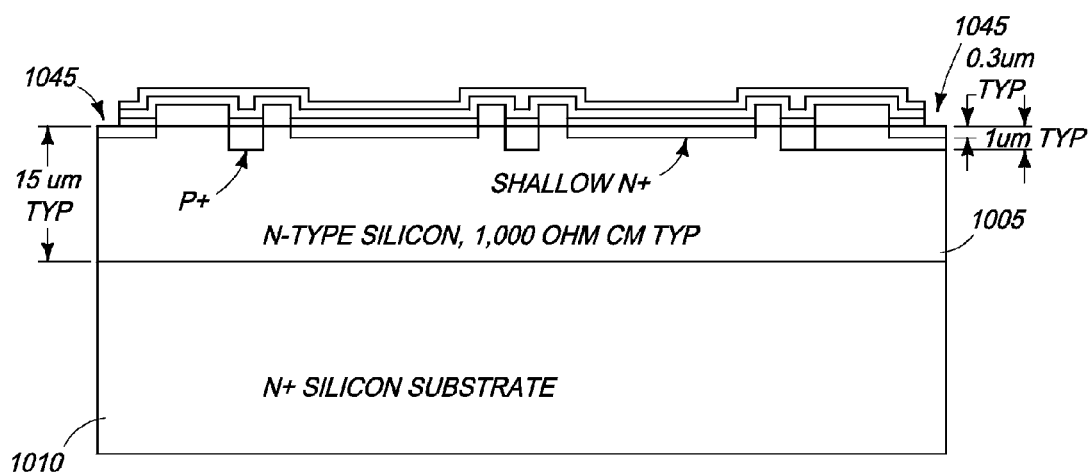
FIG. 10J is a depiction of FIG. 10I, after a contact lithography step, in one embodiment of the manufacture of the fishbone photodiode array of the present invention, where shallow n+ layers are formed between adjacent p+ bones.

Now referring to FIG. 10J, in step 1090, a contact etch mask is used to etch a plurality of contact windows 1045 into the front side of the thin active layer 1005. Contact lithography, well known to those of ordinary skill in the art, involves printing an image or pattern via illumination of a photomask in direct contact with a substrate coated with an imaging photoresist layer. Typically, a contact window is an aperture defined in a surface passivation layer through which device metallization develops contact with circuit elements. The contact windows 1045 are formed on the front side of the thin active layer 1005 by using standard semiconductor technology photolithography techniques. The contact window oxide can then be removed by either standard wet or standard dry etching techniques as are well known to those of ordinary skill in the art.

In one embodiment, the contact window/etch mask is a dark field mask, which is used to remove the passivation layers in regions requiring contacts. Using the contact mask, at least one contact window 1045 is opened through the protective and passivation layers deposited on the surface of the thin active layer 1005 by etching the passivation layers from regions 1045 that remain exposed by the mask. In one embodiment, contact window etching is achieved via a chemical etching process, wherein the wafer is immersed in buffered oxide etch (BOE), a HF acid-based solution for intervals sufficient to remove the layers exposed by the contact window mask.

Figure 10K:
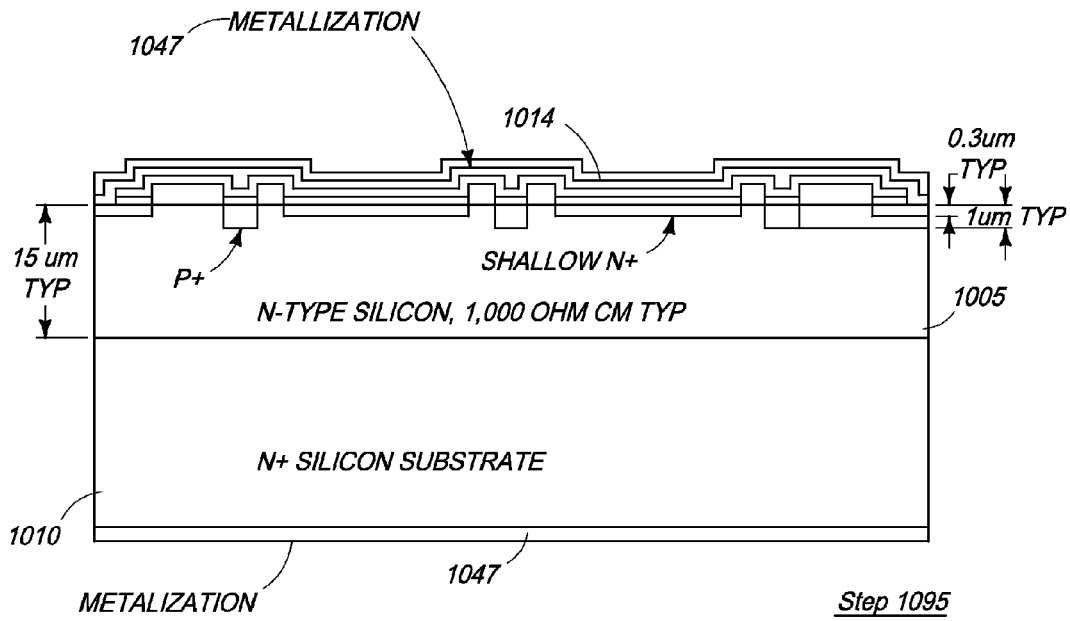
FIG. 10K is an illustration of FIG. 10J, after a metal deposition step, in one embodiment of the manufacture of the fishbone photodiode array of the present invention, where shallow n+ layers are formed between adjacent p+ bones.

Referring now to FIG. 10K, in step 1095, thin active layer 1005 and n+ silicon substrate 1010 are subjected to a metal deposition process to thereafter provide metal contacts on the front side of thin active layer 1005 and a metal layer 1047 on the back side of the n+ silicon substrate wafer 1010 for creating electrical connections. In the metal deposition process, also called metallization, metal layers 1047 are deposited on the wafer to create conductive pathways. The most common metals include aluminium, nickel, chromium, gold, germanium, copper, silver, titanium, tungsten, platinum, and tantalum. Selected metal alloys may also be used. Metallization is often accomplished with a vacuum deposition technique. The most common deposition process includes filament evaporation, electron-beam evaporation, flash evaporation, induction evaporation, and sputtering. After metallization a photoresist layer 1014 is also deposited on the front side of this active layer 1005.

Figure 10L:
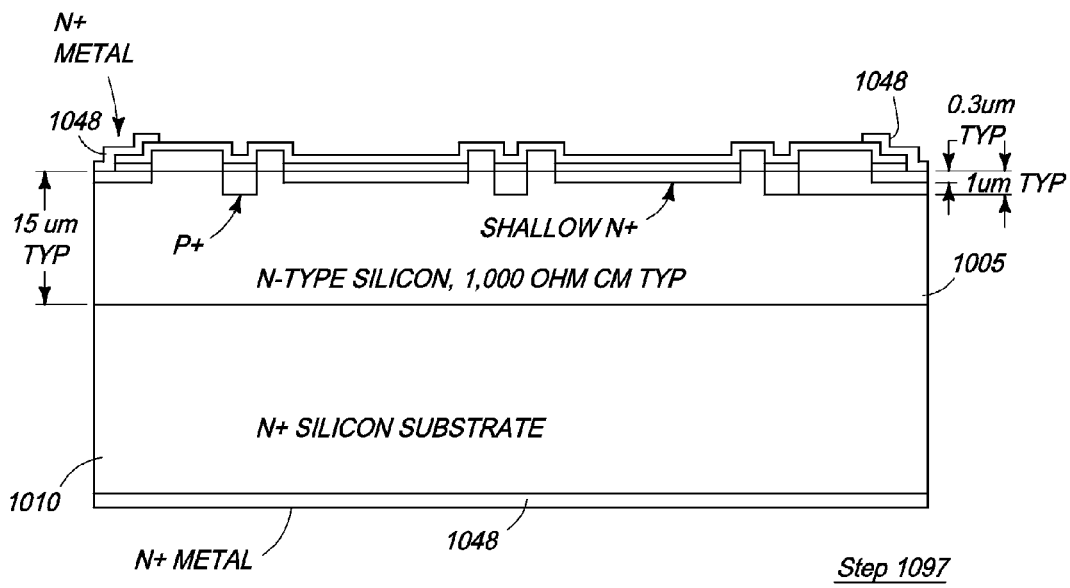
FIG. 10L is an illustration of FIG. 10K, after a metal mask lithography and selective etching, in one embodiment of the manufacture of the fishbone photodiode array of the present invention, where shallow n+ layers are formed between adjacent p+ bones.

This is followed by metal mask lithography and selective etching in step 1097 of FIG. 10L to reveal n+ metal contacts 1048 on the front side of the thin active layer 1005 and on the backside of the n+ silicon substrate 1010. In one embodiment, metal contacts 1048 are selectively etched using a metal mask and the photoresist layer 1014 (of FIG. 10K) is also stripped. Metal etching can be performed in a variety of methods, including, but not limited to abrasive etching, dry etching, electroetching, laser etching, photo etching, reactive ion etching (RIE), sputter etching, and vapor phase etching.

The above examples are merely illustrative of the structure and manufacturing steps of the photodiode array of the present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention may be modified within the scope of the appended claims.

We claim:

1. A photodiode array comprising:
a thin active area substrate having at least a front side and a back side;
at least two diode elements integrally formed in the substrate forming said array, wherein each diode element has a plurality of contiguously interconnected p+ bones, a p+ bone frame periphery and at least one shallow n+ region between adjacent p+ bones, wherein each p+ bone is protected by a thick oxide layer, and wherein a last one of the plurality of bones is part of the p+bone frame periphery; and,
a common cathode metallization on the back side and a plurality of front side anode contacts, wherein at least one of said anode contacts is connected to only the last one of the bones and wherein said anode contacts comprise at least one metal bar positioned on top of said last one of the bones and connected to a wire bonding pad.

2. The photodiode array of claim 1, further comprising an antireflective coating layer.

3. The photodiode array of claim 2, wherein said antireflective coating comprises a thin film material, said thin film material being one of an oxide, a sulfide, a fluoride, a nitride, a selenide, or a metal.

4. A photodiode array comprising:
a thin active area substrate having at least a front side and a back side;
at least two diode elements integrally formed in the substrate forming said array, wherein each diode element has a plurality of contiguously interconnected p+ bones, a p+ bone frame periphery and at least one shallow n+ region between adjacent p+ bones, wherein each p+bone is protected by a thick oxide layer, and wherein a last one of the plurality of bones is part of the p+ bone frame periphery; and,
a common cathode metallization on the back side and a plurality of front side anode contacts, wherein said anode contacts comprise metal bars placed on each of said interconnected p+ bones as well as the p+ bone periphery and connected to a wire bonding pad.

5. The photodiode array of claim 4, further comprising an antireflective coating layer.

6. The photodiode array of claim 5, wherein said antireflective coating comprises a thin film material, said thin film material being one of an oxide, a sulfide, a fluoride, a nitride, a selenide, or a metal.

7. A photodiode array comprising:
a thin active layer substrate having at least a front side and a back side, wherein said thin active layer has a thickness of 15 µm;
a mechanical support bonded to said back side of said thin active layer substrate;
a plurality of photodiodes integrally formed in the thin active layer substrate forming said array, wherein each of said photodiodes has a p+ fishbone pattern on said front side, further comprising a plurality of widely spaced p+bones, a p+ bone frame periphery and at least one n+ region between adjacent p+ bones, wherein said n+region has a depth of 0.3µm, and wherein each p+ bone creates a p-n junction;
an oxide layer of a first thickness formed on each of said p-n junction;
an anti-reflective layer of a second thickness formed on said oxide layer, wherein said second thickness is thinner than said first thickness; and
a plurality of anode contacts provided on said front side and a common cathode metallization on said back side.

8. The photodiode array of claim 7, wherein said first thickness of said oxide layer comprises about 8000 Å of silicon oxide.

9. The photodiode array of claim 8, wherein said first thickness of said oxide layer further comprises about 425 Å of silicon nitride.

10. The photodiode array of claim 7, wherein said second thickness of said anti-reflective layer comprises about 150 Å of silicon oxide.

11. The photodiode array of claim 7, wherein said second thickness of said anti-reflective layer comprises about 425 Å of silicon nitride.

* * * * *